(12) United States Patent
Ikegami et al.

(10) Patent No.: US 12,660,177 B2
(45) Date of Patent: Jun. 16, 2026

(54) MEMORY SYSTEM WITH A PLURALITY OF SELECT STRING LINES

(71) Applicant: Kioxia Corporation, Tokyo (JP)

(72) Inventors: Kazutaka Ikegami, Inagi (JP); Hidehiro Shiga, Yokohama (JP); Shingo Nakazawa, Kamakura (JP)

(73) Assignee: Kioxia Corporation, Tokyo (JP)

( * ) Notice: Subject to any disclaimer, the term of this patent is extended or adjusted under 35 U.S.C. 154(b) by 183 days.

(21) Appl. No.: 18/435,113

(22) Filed: Feb. 7, 2024

(65) Prior Publication Data

US 2024/0244839 A1 Jul. 18, 2024

Related U.S. Application Data

(63) Continuation of application No. PCT/JP2022/010073, filed on Mar. 8, 2022.

(30) Foreign Application Priority Data

Aug. 18, 2021 (JP) ................................. 2021-133526

(51) Int. Cl.
$H10B\ 41/35$ (2023.01)
$H10B\ 41/27$ (2023.01)
$H10B\ 41/47$ (2023.01)

(52) U.S. Cl.
CPC ............. H10B 41/35 (2023.02); H10B 41/27 (2023.02); H10B 41/47 (2023.02)

(58) Field of Classification Search
CPC ........ H10B 41/35; H10B 41/27; H10B 41/47; H10B 43/27; G11C 16/32; G11C 11/5642;

(Continued)

(56) References Cited

U.S. PATENT DOCUMENTS

2017/0271021 A1 9/2017 Futatsuyama et al.
2018/0082753 A1* 3/2018 Maejima ................ G11C 16/26
(Continued)

FOREIGN PATENT DOCUMENTS

JP 2017-168163 A 9/2017
JP 2018-164070 A 10/2018
JP 2019-79885 A 5/2019

OTHER PUBLICATIONS

International Search Report issued Jun. 7, 2022 in PCT/JP2022/010073 filed on Mar. 8, 2022, 2 pages.

*Primary Examiner* — Jerome Leboeuf
(74) *Attorney, Agent, or Firm* — Oblon, McClelland, Maier & Neustadt, L.L.P.

(57) ABSTRACT

A memory system for low power consumption and high speed read operation in the memory system includes a source line, a string select line having i layers, a first word line having i layers, a second word line having i layers, a select gate line having 1 layer which is divided into 2n, a plurality of memory pillars and a control circuit. Each of the plurality of memory pillars includes a first string and a second string. The first string includes a first transistor, i first memory cells and j second memory cells. The first transistor, the i first memory cells, and the j second memory cells are electrically connected in series. The second string includes a second transistor, i third memory cells, and j fourth memory cells. The second transistor, the i third memory cells, and the j fourth memory cells are electrically connected in series.

8 Claims, 30 Drawing Sheets

(58) Field of Classification Search
CPC ..... G11C 16/0483; G11C 16/04; G11C 16/08;
G11C 16/24; G11C 16/26; G11C
16/3418; G11C 16/3427; H10D 30/021;
H10D 30/68; H10D 30/69
See application file for complete search history.

(56)                   References Cited

U.S. PATENT DOCUMENTS

| | | |
|---|---|---|
| 2018/0277565 A1 | 9/2018 | Futatsuyama et al. |
| 2019/0122734 A1 | 4/2019 | Shibata et al. |
| 2021/0013227 A1* | 1/2021 | Futatsuyama .......... H10B 43/35 |
| 2022/0020432 A1 | 1/2022 | Li |

* cited by examiner

FIG. 2

BLK

BL0 BL1 BL2 BL3 BL4 BL5 BL6 BL7

SGD0

SLT1

10-0d

SLT2

10-1a(SGD1)

SLT2

10-1b(SGD1)

SGD2

10-2d 10-3a(SGD3)

10-3b(SGD3)

SLT1

SLT2

MP4     MP0     MP8     MP12

MP5     MP1     MP9     MP13

MP6     MP2     MP10     MP14

MP7     MP3     MP11     MP15

10-0a(SGD0)

SGD1

10-1d 10-0b(SGD0)

10-2a(SGD2)

SGD3

10-3d 10-2b(SGD2)

10-0c(SGD0)

1st connect          memory cell          2nd connect

Y
Z ⊙ → X

BLK

SLT1

11e

SLT2

A 11-0a(WLe7)

MP4

MP12

11-1(WLo7)

MP0

MP8

11o

SLT2

MP5

11-2(WLe7)

MP13

B 11-3(WLo7)

B'

MP1

MP9

11-8

11-4(WLe7)

MP6

MP14

11-5(WLo7)

MP2

MP10

11-9

11-6(WLe7)

MP7

MP15

11-7(WLo7)

MP3

MP11

11-0b(WLe7)

SLT1

A'

1st connect　　　memory cell　　2nd connect

SLT2

BLK

SGD0

SGD1

SGD2

SGD3

MPGR0

MPGR1

MPGR0

MP4     MP12

MP0     MP8

MP5     MP13

MP1     MP9

MP6     MP14

MP2     MP10

MP7     MP15

MP3     MP11

Y
Z ⊙ → X

TYPE B

MP2, MP6, MP7, MP10, MP14, MP15

TYPE C

FIG. 21

| | MHGR | |
|---|---|---|
| | 0 | 1 |
| STR_SEL0 | ◯ | |
| STR_SEL1 | | ◯ |

BLK

SGD0

SGD1

SGD2

MHGR1

SGD3

MP4   MP12

MP0   MP8

MP5   MP13

MP1   MP9

MP6   MP14

MP2   MP10

MP7   MP15

MP3   MP11

MHGR0

MHGR0

Y

Z ⊙ → X

BLK

FIG. 25

| | MHGR | | | | | | | |
|---|---|---|---|---|---|---|---|---|
| | 0 | 1 | 2 | 3 | 4 | 5 | 6 | 7 |
| STR_SEL0 | ◯ | | | | | | | |
| STR_SEL1 | | ◯ | | | | | | |
| STR_SEL2 | | | ◯ | | | | | |
| STR_SEL3 | | | | ◯ | | | | |
| STR_SEL4 | | | | | ◯ | | | |
| STR_SEL5 | | | | | | ◯ | | |
| STR_SEL6 | | | | | | | ◯ | |
| STR_SEL7 | | | | | | | | ◯ |

FIG. 26

| | MHGR | | | | | | | |
|---|---|---|---|---|---|---|---|---|
| | 0 | 1 | 2 | 3 | 4 | 5 | 6 | 7 |
| STR_SEL0 | ◯ | ◯ | ◯ | ◯ | | | | |
| STR_SEL1 | ◯ | | | | ◯ | ◯ | ◯ | |
| STR_SEL2 | | ◯ | | | ◯ | | | ◯ |
| STR_SEL3 | | | ◯ | | | ◯ | | ◯ |
| STR_SEL4 | | | | ◯ | | | ◯ | |

TYPE B

MP2, MP6, MP7, MP10, MP14, MP15

MEMORY SYSTEM WITH A PLURALITY OF SELECT STRING LINES

CROSS REFERENCE TO RELATED APPLICATIONS

This application is a Continuation of International Patent Application No. PCT/JP2022/010073, filed on Mar. 8, 2022, which claims the benefit of priority to Japanese Patent Application No. 2021-133526 filed on Aug. 18, 2021, the entire contents of which are incorporated herein by reference.

FIELD

Embodiments of the present disclosures relate to a memory system provided with a semiconductor storage device.

BACKGROUND

A memory system, which includes a NAND-type flash memory as a semiconductor storage device and a controller, which controls the NAND-type flash memory, is known (for example, Japanese laid-open patent publication No. 2017-168163 and Japanese laid-open patent publication No. 2018-164070).

SUMMARY

A memory system according to an embodiment includes: a source line expanding to a first direction and a second direction intersecting with the first direction; a string select line having j layers ("j" is one or more integer number) and provided in a third direction intersecting the first direction and the second direction with respect to the source line; a first word line having i layers ("i" is two or more integer number) stacked in the third direction and provided in the third direction with respect to the string select line; a second word line having i layers, provided in the third direction with respect to the string select line and stacked in the third direction, a position of i layers of the second word line in the third direction being the same as i layers of the first word line; a select gate line having 1 layer provided in the third direction with respect to the first word line and the second word line and divided into 2n ("n" is one or more integer number) in a plan expanding to the first direction and the second direction; a plurality of memory pillars having semiconductor layers, provided between the first word line and the second word line, provided between the select gate lines facing each other among 2n the select gate lines and extended in the third direction; and a control circuit. The plurality of memory pillar is electrically connected to the source line. Each of the plurality of memory pillar has a first string provided in a first side of the memory pillar and a second string provided in a second side of the memory pillar. The first string has a first transistor, i first memory cells and j second memory cells. The i first memory cells is provided between the first transistor and the second memory cell the closest to the first transistor among the j second memory cells. The first transistor, the i memory cells and the j second memory cells are electrically connected in series. The first transistor is connected to one of the select gate line among the 2n select gate lines. The i first memory cells are electrically connected in series, provided along the third direction and connected to the i first word line, respectively. The second string has a second transistor, i third memory cells and j fourth memory cells. The i third memory cells is provided between the second transistor and the fourth memory cell the closest to the second transistor among the j fourth memory cells. The second transistor, the i third memory cells and the j fourth memory cells are electrically connected in series. The second transistor is connected to one of the select gate line among the 2n select gate lines. The i third memory cells are electrically connected in series, provided along the third direction and connected to the i second word line, respectively. A position of the #1 first word line among the i layers first word line is the closest to a position of the source line and a position of the #i first word line is the farthest from a position of the source line. A position of the #1 second word line among the i layers second word line is the closest to the position of the source line and a position of the #i second word line is the farthest from the position of the source line. The i first memory cells and the i third memory cells share the semiconductor layer. The j is no larger than the n in the second memory cell and the fourth memory cell.

BRIEF DESCRIPTION OF DRAWINGS

FIG. 2 is a block diagram showing a signal system of a memory system according to an embodiment.

FIG. 8 is a B-B' cross-sectional view of the semiconductor storage device shown in FIG. 6.

FIG. 21 is a diagram showing a relationship between a string select line and a memory pillar group in a semiconductor memory device according to an embodiment.

FIG. 25 is a diagram showing a relationship between a string select line and a memory pillar group in a semiconductor memory device according to an embodiment.

FIG. 26 is a diagram showing a relationship between a string select line and a memory pillar group in a semiconductor memory device according to an embodiment.

DESCRIPTION OF EMBODIMENTS

Figure 1:
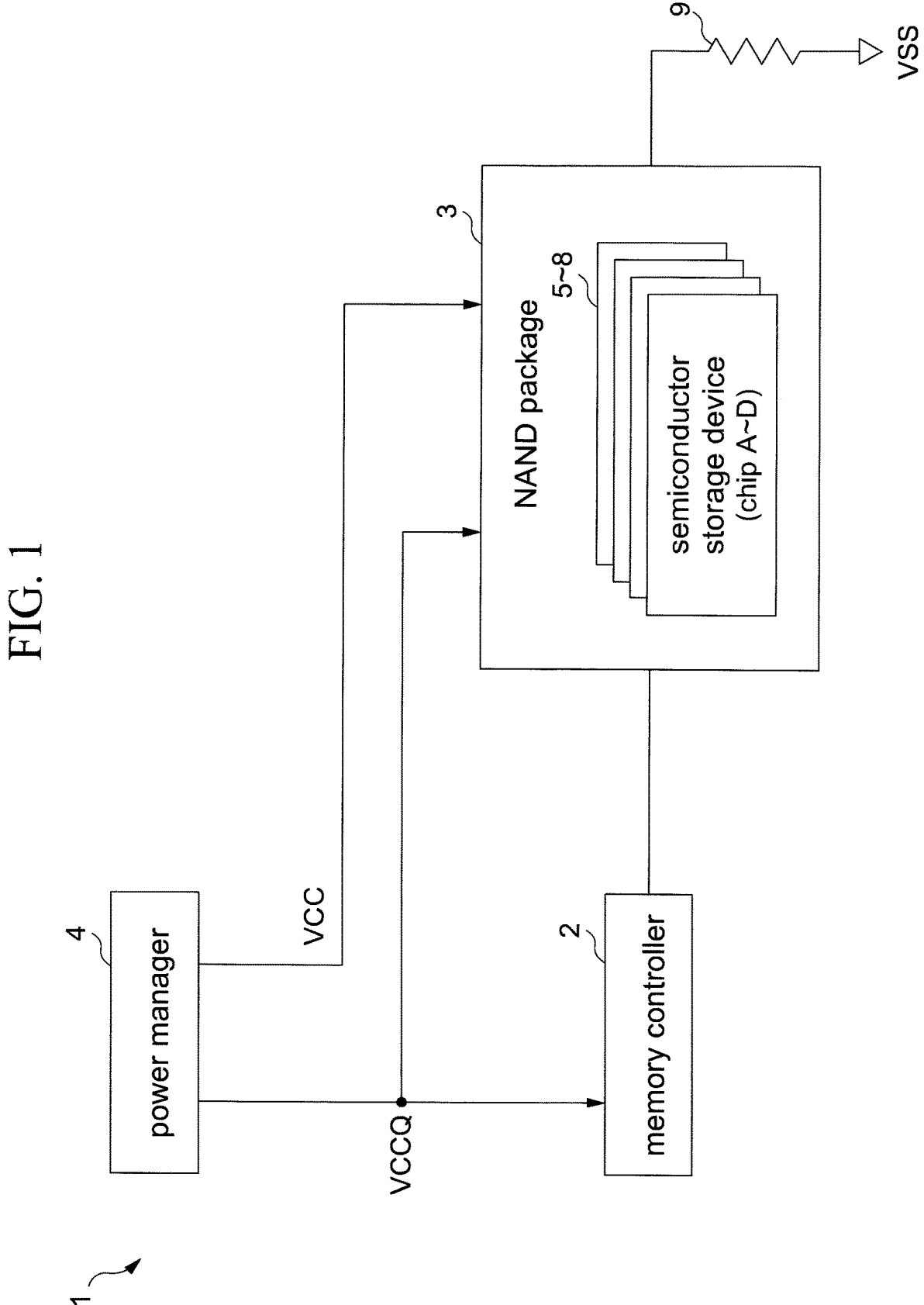
FIG. 1 is a block diagram showing a power supply system of a memory system according to an embodiment.

Hereinafter, a non-volatile semiconductor storage device according to the present embodiments are described in detail by referring to the drawings. In the following description, elements having substantially the same functions and configurations are denoted by the same reference numerals and are described redundantly only when necessary. Each of the embodiments described below exemplifies a device and a method for embodying the technical idea of this embodiment. The technical idea of the embodiment is not limited to the material, shape, structure, arrangement and the like of the constituent parts described below. Various modifications may be made to the technical idea of the embodiment in addition to the scope of the claims.

In the following description, signals X<n:0> ("n" is a natural number) are made up of (n+1)-bit signals, and mean a group of signals X<0>, X<1>, . . . , and X<n>, each of which is a 1-bit signal. Elements Y<n:0> mean a group of elements Y<0>, Y<1>, . . . , and Y<n>, which correspond to the input or output of the signals X<n:0> in a one-to-one relationship.

In the following description, a signal BZ indicates that it is an inverted signal of a signal Z. Alternatively, in the case where the signal Z is a control signal, the signal Z is a positive logic and the signal BZ is a negative logic. That is, the "H" level of the signal Z corresponds to assertion, and the "L" level of the signal Z corresponds to negation. The "L" level of the signal BZ corresponds to assertion, and the "H" level of the signal Z corresponds to negation.

In the following description, the notation A/B means A or B. For example, "X includes A/B, C/D and E" includes the case "X includes A, C and E" and "X includes B, D and E."

One of the purposes of an embodiment of the present invention is to realize low power consumption and high speed read operation in a memory system.

1. First Embodiment

A memory system according to a first embodiment is described with reference to FIG. 1 to FIG. 24. The memory system according to the first embodiment includes, for example, a NAND-type flash memory as a semiconductor storage device and a memory controller which controls the NAND-type flash memory.

1-1. Overall Configuration of Memory System

The overall configuration of the memory system according to the first embodiment is described with reference to FIG. 1 and FIG. 2. A memory system 1 communicates with, for example, an external host device (not shown). The memory system 1 holds data received from the host device and transmits data which is read from semiconductor storage devices 5 to 8 to the host device.

FIG. 1 is a diagram for explaining a power supply system of the memory system according to the first embodiment. As shown in FIG. 1, the memory system 1 includes a memory controller 2, a NAND package 3, a power manager 4 and a reference resistance 9. The NAND package 3 includes, for example, a plurality of semiconductor storage devices 5 to 8. In FIG. 1, four chips are included in the NAND package 3. In the following discussion, the semiconductor storage devices 5 to 8 may be read as chips A to D, respectively.

The power manager 4 is an integrated circuit (IC) for managing the voltage to be supplied to the memory controller 2 and the NAND package 3. The power manager 4 supplies, for example, a voltage VCCQ to the memory controller 2 and the NAND package 3. The voltage VCCQ is used as a reference of the voltage that is used for an input/output signal between the memory controller 2 and the NAND package 3. In addition, the power manager 4 supplies, for example, a voltage VCC to the NAND package 3. The voltage VCC is used as a reference voltage of other voltages used in the NAND package 3.

The NAND package 3 is connected to a voltage VSS via the reference resistor 9. The reference resistor 9 is used, for example, to calibrate an output impedance of each of the semiconductor storage devices 5 to 8 in the NAND package 3. The voltage VSS is a ground voltage, and is defined as, for example, ground (0 V) in the memory system 1.

Figure 2:
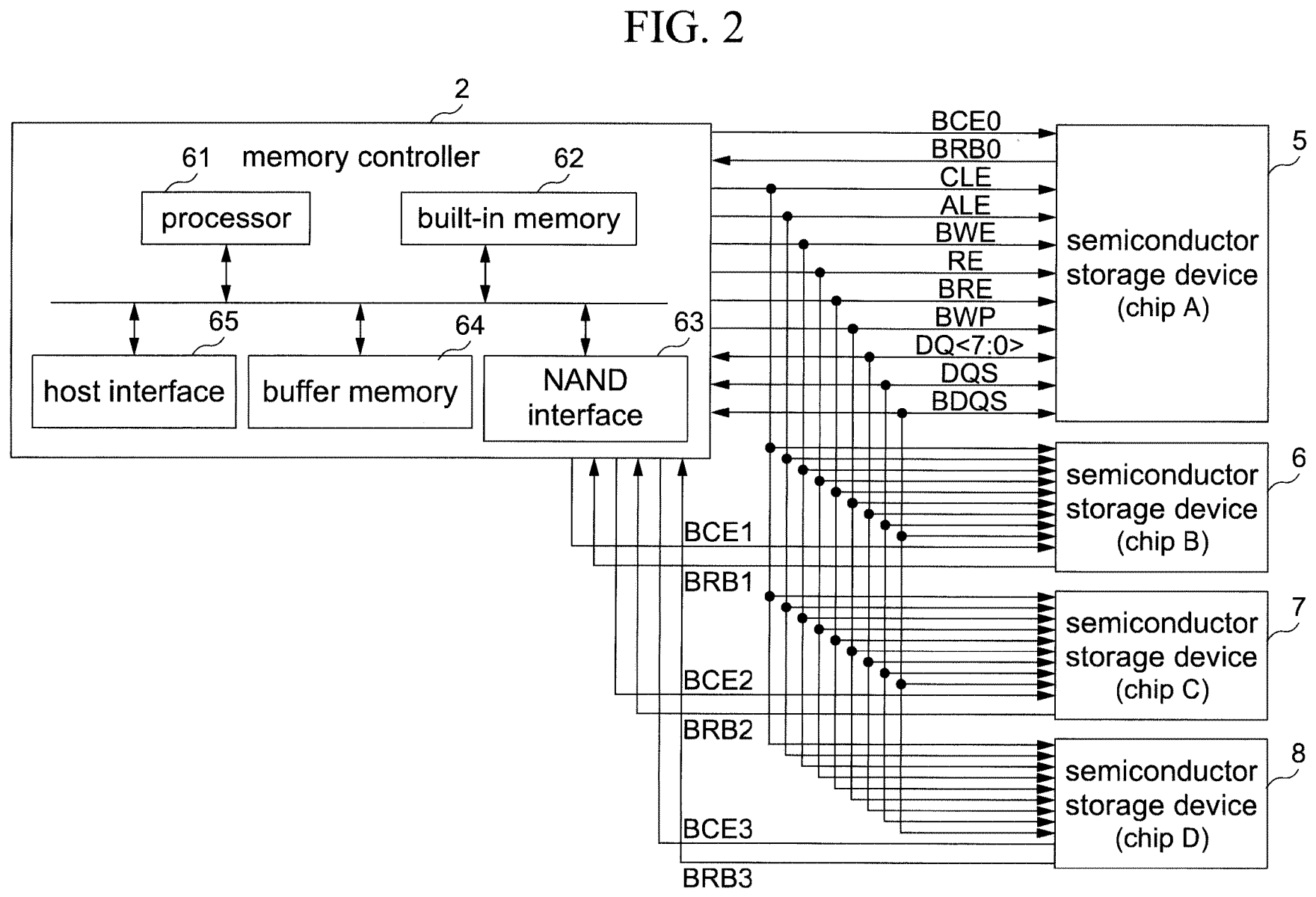

FIG. 2 is a block diagram for explaining a configuration of a signal system of a memory system according to an embodiment. As shown in FIG. 2, the memory controller 2 controls the semiconductor storage devices 5 to 8. Specifically, the memory controller 2 writes data to the semiconductor storage devices 5 to 8 and reads data from the semiconductor storage devices 5 to 8. The memory controller 2 is connected to the semiconductor storage devices 5 to 8 by a NAND bus.

Each of the semiconductor storage devices 5 to 8 includes a plurality of memory cells and stores data in a non-volatile manner. Each of the semiconductor storage devices 5 to 8 is a semiconductor chip that can be uniquely identified, for example, by being supplied with an individual chip enable signal or by being pre-assigned with an individual chip address. Therefore, each of the semiconductor storage devices 5 to 8 can be operated independently according to instructions of the memory controller 2.

Similar signals are transmitted and received on the NAND bus connected to each of the semiconductor storage devices 5 to 8. The NAND bus includes a plurality of signal lines to transmit and receive signals according to a NAND interface. BCE is a chip enable signal and operates in negative logic. BRB is a ready busy signal and operates in negative logic. CLE is a command latch enable signal and operates in positive logic. ALE is an address latch enable signal and operates in positive logic. BWE is a write enable signal and operates in negative logic. RE and BRE are read enable signals and inverted signals of them. The RE operates in positive logic. The BRE operates in negative logic. For example, the RE and/or BRE function as output instruction signals. BWP is a write protect signal and operates in negative logic.

DQ<7:0> is a data signal. The data signal DQ<7:0> is input and output via the input/output terminal (I/O port). Signals DQS and BDQS are a data strobe signal and an inverted signal of the data strobe signal. For example, the DQS and/or the BDQS function as the strobe signal or a timing control signal. The strobe signal (DQS/BDQS) is a signal pair having opposite phases. The strobe signal is a signal defining timing of transmitting and receiving the data signal DQ<7:0>. Signals BCE0 to BCE3 are transmitted from the memory controller 2 to each of the storage devices 5 to 8 independently. Signals BRB0 to BRB3 are transmitted independently from each of the semiconductor storage devices 5 to 8 to the memory controller 2. The signals CLE, ALE, BWE, RE, BRE and BWP are commonly transmitted from the memory controller 2 to the semiconductor storage devices 5 to 8.

The signals BCE0 to BCE3 are signals for enabling semiconductor storage devices 5 to 8, respectively. The signal CLE notifies the semiconductor storage devices 5 to 8 that the data signals DQ<7:0> flowing to the semiconductor storage devices 5 to 8 are commands while the signal CLE is at the "high (H)" level. The signal ALE notifies the semiconductor storage devices 5 to 8 that the data signals DQ<7:0> flowing to the semiconductor storage devices 5 to 8 are addresses while the signal ALE is at the "H" level. The signal BWE instructs the semiconductor storage devices 5 to 8 to write the data signals DQ<7:0> flowing to the semiconductor storage devices 5 to 8 while the signal BWE is at the "low (L)" level.

The signals RE and BRE instruct the semiconductor storage devices 5 to 8 to output the data signals DQ<7:0>, and for example, are used to control the operation timing of the semiconductor storage devices 5 to 8 when outputting the data signals DQ<7:0>. The signal BWP instructs the semiconductor storage devices 5 to 8 to prohibit data writing and erasing. The signals BRB0 to BRB3 respectively indicate whether the semiconductor storage devices 5 to 8 are in a ready state (a state of accepting a command from the outside) or in a busy state (a state of not accepting a command from the outside).

The data signals DQ<7:0> are, for example, 8-bit signals. The data signals DQ<7:0> are transmitted and received between the semiconductor storage devices 5 to 8 and the memory controller 2, and include commands, addresses, and data. The signals DQS and BDQS may be generated, for example, based on the signals RE and BRE, and are used to control the operation timing of the semiconductor storage devices 5 to 8 in response to the data signals DQ<7:0>.

The memory controller 2 includes a processor (central processing unit (CPU)) 61, a built-in memory (random access memory (RAM)) 62, a NAND interface circuit 63, a buffer memory 64 and a host interface circuit 65.

The processor 61 controls the overall operation of the memory controller 2. The processor 61 issues, for example, a write command based on a NAND interface to the semiconductor storage devices 5 to 8 in response to a write command of data received from the outside. This function is equally applied to other operations such as, for example, read, erasing and calibration operations.

The built-in memory 62 is, for example, a semiconductor memory such as, for example, dynamic RAM (DRAM), and is used as a work region of the processor 61. The built-in memory 62 holds, for example, firmware and various management tables for managing the semiconductor storage devices 5 to 8.

The NAND interface circuit 63 is connected to the semiconductor storage devices 5 to 8 via the NAND bus described above, and executes communication with the semiconductor storage devices 5 to 8. The NAND interface circuit 63 transmits commands, addresses, and write data to the semiconductor storage devices 5 to 8 in response to an instruction of the processor 61. In addition, the NAND interface circuit 63 receives statuses and read data from the semiconductor storage devices 5 to 8.

The buffer memory 64 temporarily holds, for example, data received by the memory controller 2 from the semiconductor storage devices 5 to 8 and the outside.

The host interface circuit 65 is connected to an external host device (not shown), and executes communication with the host device. The host interface circuit 65 transfers, for example, commands and data, received from the host device to the processor 61 and the buffer memory 64, respectively.

1-2. Configuration of Semiconductor Storage Device

The configuration of the semiconductor storage device according to the first embodiment is described with reference to FIG. 3. The semiconductor storage devices 5 to 8 have, for example, the same configuration. Therefore, in the following description, a configuration of the semiconductor storage device 5, among the semiconductor storage devices 5 to 8, is described, and a description related to a configuration of the semiconductor storage devices 6 to 8 is omitted.

Figure 3:
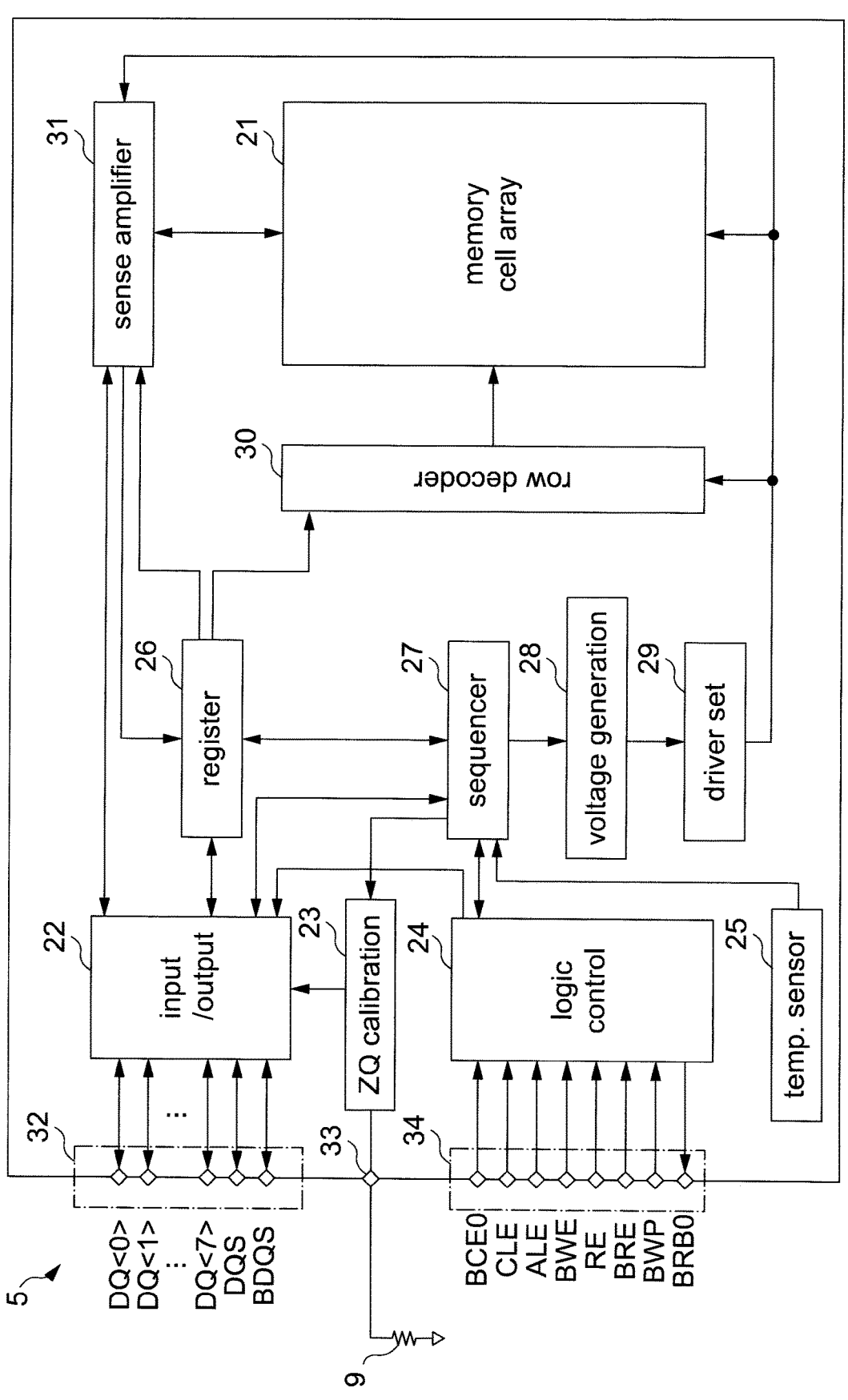
FIG. 3 is a block diagram showing a configuration of a semiconductor storage device according to an embodiment.

As shown in FIG. 3, the semiconductor storage device 5 includes a memory cell array 21, an input/output circuit 22, a ZQ calibration circuit 23, a logic control circuit 24, a temperature sensor 25 (temp. sensor), a register 26, a sequencer 27, a voltage generation circuit 28, a driver set 29, a row decoder 30, a sense amplifier 31, an input/output pad group 32, a ZQ calibration pad 33 and a logic-control pad group 34.

The memory cell array 21 includes a plurality of nonvolatile memory cells (not shown) associated with word lines and bit lines.

The input/output circuit 22 transmits and receives the data signals DQ<7:0> to and from the memory controller 2. The input/output circuit 22 transfers commands and addresses in the data signals DQ<7:0> to the register 26. The input/output circuit 22 transmits and receives write data and read data to and from the sense amplifier 31.

The ZQ calibration circuit 23 calibrates the output impedance of the semiconductor storage device 5 based on the reference resistor 9 via the ZQ calibration pad 33.

The logic control circuit 24 receives the signals BCE0, CLE, ALE, BWE, RE, BRE and BWP from the memory controller 2. In addition, the logic control circuit 24 transfers the signal BRB0 to the memory controller 2 and notifies the state of the semiconductor storage device 5 to the outside.

The temperature sensor 25 measures the temperature inside the semiconductor storage device 5. The temperature sensor 25 sends information on the measured temperature to the sequencer 27. Further, the temperature sensor 25 may be provided at any position in the semiconductor storage device 5 in a range within which it may measure the temperature that may be regarded as the temperature of the memory cell array 21.

The register 26 holds commands and addresses. The register 26 transfers the addresses to the row decoder 30 and the sense amplifier 31, and transfers the commands to the sequencer 27.

The sequencer 27 receives the commands, and controls the entire semiconductor storage device 5 according to the sequence based on the received commands. The sequencer 27 sends information on the temperature, received from the temperature sensor 25, to the memory controller 2 via the input/output circuit 22.

The voltage generation circuit 28 generates voltages required for operations such as, for example, data writing, reading and erasing based on an instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the addresses from the register 26. The driver set 29 supplies various voltages to the row decoder 30 based on, for example, a row address among the addresses.

The row decoder 30 receives the row address, among the addresses, from the register 26, and selects the memory cells in the row based on the row address. Then, the voltages from the driver set 29 are transferred to the memory cells in the selected row via the row decoder 30.

At the time of reading data, the sense amplifier 31 senses read data that are read from the memory cells to the bit lines, and transfers the sensed read data to the input/output circuit 22. At the time of writing data, the sense amplifier 31 transfers write data via the bit lines to the memory cells. The sense amplifier 31 receives a column address, among the addresses, from the register 26, and outputs column data based on the column address.

The input/output pad group 32 transfers the data signal DQ<7:0>, the signal DQS and the signal BDQS, received from the memory controller 2, to the input/output circuit 22. The input/output pad group 32 transfers the data signal DQ<7:0>, transmitted from the input/output circuit 22, to the outside of the semiconductor storage device 5.

The ZQ calibration pad 33 is connected at one end thereof to the reference resistor 9 and at the other end thereof to the ZQ calibration circuit 23.

The logic control pad group 34 transfers signals BCE0, CLE, ALE, BWE, RE, BRE and BWP received from the memory controller 2 to the logic control circuit 24. The logic control pad group 34 transfers BRB0 transmitted from the logic control circuit 24 to the exterior of the semiconductor storage device 5.

1-3. Configuration of Memory Cell Array 21

[1-3-1. Circuit Configuration of Memory Cell Array 21]

Figure 4:
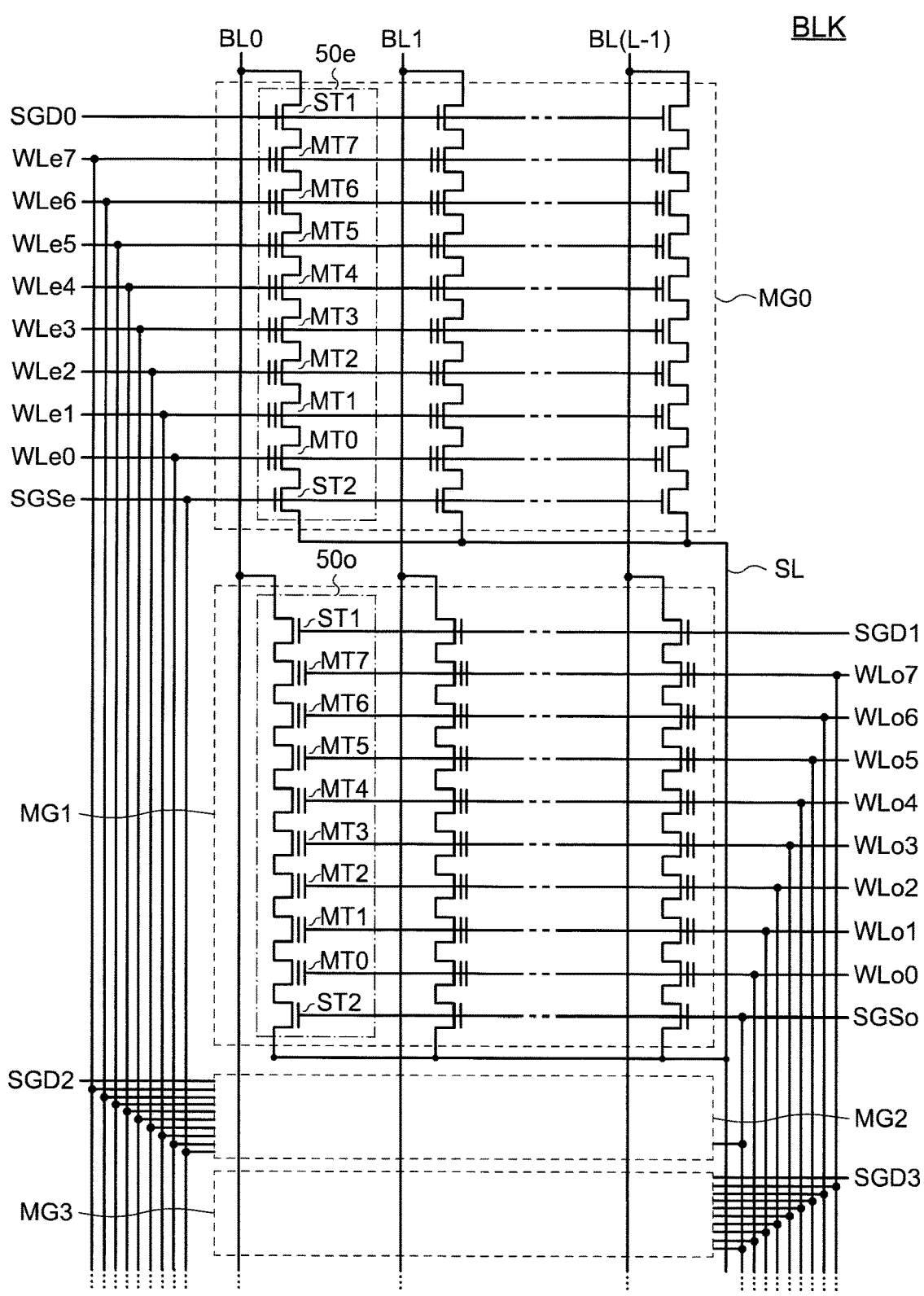
FIG. 4 is a diagram showing a circuit configuration of a memory cell array of a semiconductor storage device according to an embodiment.

The circuit configuration of the memory cell array 21 will be described with reference to FIG. 4. FIG. 4 is an equivalent circuit diagram of a block BLK. As shown in FIG. 4, the block BLK includes a plurality of memory pillars MP. Each memory pillars MP includes a plurality of NAND strings 50. In the following description, a NAND string adjacent to even-numbered select gate lines SGD0 and SGD2 is referred to as a NAND string 50e. A NAND string adjacent to odd-numbered select gate lines SGD1 and SGD3 is referred to as a NAND string 50o.

Each of the NAND strings 50 includes, for example, eight memory cell transistors MT (MT0 to MT7) and select transistors ST1 and ST2. The memory cell transistor MT includes a control gate and a charge storage layer. The memory cell transistor MT has a threshold voltage and is in an on-state when a voltage equal to or higher than the threshold voltage is applied to the control gate. When a write operation to the memory cell transistor MT is performed, the threshold voltage of the memory cell transistor MT varies. That is, the threshold voltage of the memory cell transistor MT varies when electrons are injected into the charge storage layer of the memory cell transistor MT. The threshold voltage of the memory cell transistor MT in a state where electrons are injected into the charge storage layer is higher than the threshold voltage of the memory cell transistor MT in a state where no electrons are injected into the charge storage layer. The memory cell transistor MT holds data in a non-volatile manner by variations of the threshold voltage due to the injection of electrons into the charge storage layer. The eight memory cell transistors MT are connected in series between a source of the select transistor ST1 and a drain of the select transistor ST2.

Gates of the select transistor ST1 in each of the plurality of memory pillar MP are connected to select gate lines SGD (SGD0, SGD1, . . . ) respectively. Each select gate line SGD is independently controlled by the row decoder 30. A gate of the select transistor ST2 in the NAND string 50e is commonly connected to a select gate line SGSe. A gate of the select transistor ST2 in the NAND string 50o is commonly connected to a select gate line SGSo. The select gate lines SGSe and SGSo may be commonly connected or independently controllable.

The control gates of the memory cell transistors MT (MT0 to MT7) included in the NAND string 50e in the same block BLK are commonly connected to word lines WLe (WLe0 to WLe7), respectively. On the other hand, the control gates of the memory cell transistors MT (MT0 to MT7) included in the NAND string 50o are commonly connected to word lines WLo (WLo0 to WLo7), respectively. The word lines WLe and WLo are independently controlled by the row decoder 30.

The block BLK is, for example, an erasure unit of data. That is, data held by the memory cell transistors MT included in the same block BLK are collectively erased. The threshold voltage of the memory cell transistor MT in an erased state is lower than the threshold voltage of the memory cell transistor MT in a written state.

In the memory cell array 21, the drains of the select transistors ST1 included in the NAND strings 50 provided in the same column are commonly connected to a bit line BL (BL0 to BL(L−1)). L is a natural number of 2 or more. That is, the bit lines BL are commonly connected to the NAND strings 50 adjacent to different select gate lines. In the memory cell array 21, the sources of the plurality of select transistors ST2 are commonly connected to a source line SL.

That is, the NAND strings 50 adjacent to the same select gate line SGD are connected to different bit lines BL. In the block BLK, the NAND strings 50 adjacent to the different select gate lines SGD share word lines WL. The memory cell array 21 includes a plurality of block BLK having the same bit line BL. In the memory cell array 21, the select gate lines SGS, the word lines WL, and the select gate lines SGD are stacked above the semiconductor substrate, so that the memory cell transistors MT are three-dimensionally stacked.

Although memory cell transistors DMT0 and DMT1 are provided between the select transistor ST2 and the memory cell transistor MT0 in the present embodiment, these are omitted in FIG. 4 for convenience of explanation.

[1-3-2. Planar Layout of Memory Cell Array 21]

Figure 5:
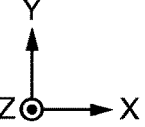
FIG. 5 is a diagram showing a layout of select gate lines, bit lines, and memory pillars of a semiconductor storage device according to an embodiment.

A planar configuration of the memory cell array 21 will be described with reference to FIG. 5. FIG. 5 shows a planar layout of the select gate lines SGD in a semiconductor substrate plane (X-Y plane) of a certain block BLK. In the present embodiment, a configuration in which four select gate lines SGD are included in one block BLK is described.

As shown in FIG. 5, wiring layers 10-0a, 10-0b, and 10-0c having a longitudinal in the X-direction are connected by a first connecting section 10-0d (1st connect) having a longitudinal in the Y-direction. The two wiring layers 10-0a and 10-0c are provided at both ends in the Y-direction. The wiring layers 10-0a and 10-0b are adjacent to each other in the Y-direction with the other one wiring layer (a wiring layer 10-1a) interposed therebetween. The first connecting section 10-0d is provided at a first end in the X-direction. Three wiring layers 10-0a, 10-0b, and 10-0c function as the select gate line SGD0.

The wiring layers 10-1a and 10-1b having the longitudinal in the X-direction are connected by a second connecting section 10-1d (2nd connect) having the longitudinal in the Y-direction. The wiring layer 10-1a is provided between the wiring layers 10-0a and 10-0b. The wiring layer 10-1b is provided between the wiring layer 10-0b and the other one wiring layer (a wiring layer 10-2a). The second connecting section 10-1d is provided on a second end which is the opposite side of the first connecting section 10-0d in the X-direction. The two wiring layers 10-1a and 10-1b function as the select gate line SGD1.

The wiring layers 10-2a and 10-2b having the longitudinal in the X-direction are connected by a first connecting section 10-2d having the longitudinal in the Y-direction. Similarly, wiring layers 10-3a and 10-3b having the longitudinal in the X-direction are connected by a second connecting section 10-3d having the longitudinal in the Y-direction. The wiring layer 10-2a is provided between the wiring layer 10-1b and the wiring layer 10-3a. The wiring layer 10-3a is provided between the wiring layer 10-2a and the wiring layer 10-2b. The wiring layer 10-2b is provided between the wiring layer 10-3a and the wiring layer 10-3b. The wiring layer 10-3b is provided between the wiring layer 10-2b and the wiring layer 10-0c. The first connecting section 10-2d is provided at a first end in the X-direction. The second connecting section 10-3d is provided at the second end in the X-direction. In the X-direction, the first end is an end portion on the same side as the first connecting section 10-0d, the second end is an end portion on the opposite side of the first connecting section 10-0d. The two wiring layers 10-2a and 10-2b function as the select gate line SGD2. The two wiring layers 10-3a and 10-3b function as the select gate line SGD3.

In the present embodiment, a configuration in which each wiring layer is connected by the first connecting sections 10-0d and 10-2d, or the second connecting sections 10-1d and 10-3d is exemplified but is not limited to this configuration. For example, each wiring layer may be independent and controlled so that the same voltage is supplied to the wiring layers 10-0a, 10-0b, and 10-0c, the same voltage is supplied to the wiring layers 10-1a and 10-1b, the same voltage is supplied to the wiring layers 10-2a and 10-2b, and the same voltage is supplied to the wiring layers 10-3a and 10-3b.

The wiring layers 10 adjacent to each other in the Y-direction in the block BLK are insulated. A region that insulates the adjacent wiring layers 10 is referred to as a slit SLT2. In the slit SLT2, for example, an insulation layer is embedded in a region from a surface of the semiconductor substrate to a layer where at least the wiring layer 10 is provided. In the memory cell array 21, for example, the plurality of blocks BLK shown in FIG. 5 is arranged, in the Y-direction. Between the blocks BLK adjacent to each other in the Y-direction is also insulated in the same manner as described above. A region that insulates the adjacent blocks BLK is referred to as a slit SLT1. The slit SLT1 has the same configuration as the slit SLT2.

The plurality of memory pillars MP (MP0 to MP15) is provided between the wiring layers 10 adjacent to each other in the Y-direction. Each of the plurality of memory pillars MP has the longitudinal in the Z-direction. The Z-direction is a direction orthogonal (or intersecting) to the X-Y direction, that is, a direction orthogonal to the surface of the semiconductor substrate. The plurality of memory pillars MP is provided in a memory cell section (memory cell).

Specifically, the memory pillars MP4 and MP12 are provided between the wiring layers 10-0a and 10-1a. The memory pillars MP0 and MP8 are provided between the wiring layers 10-1a and 10-0b. The memory pillars MP5 and MP13 are provided between the wiring layers 10-0b and 10-1b. The memory pillars MP1 and MP9 are provided between the wiring layers 10-1b and 10-2a. The memory pillars MP6 and MP14 are provided between the wiring layers 10-2a and 10-3a. The memory pillars MP2 and MP10 are provided between the wiring layers 10-3a and 10-2b. The memory pillars MP7 and MP15 are provided between the wiring layers 10-2b and 10-3b. The memory pillars MP3 and MP11 are provided between the wiring layers 10-3b and 10-0c.

The memory pillar MP is a structure body in which the select transistors ST1, ST2, and the memory cell transistor MT are formed. A detailed structure of the memory pillar MP will be described later.

The memory pillars MP0 to MP3 are arranged along the Y-direction. The memory pillars MP8 to MP11 are arranged along the Y-direction at positions adjacent to the memory pillars MP0 to MP3 in the X-direction. In other words, the memory pillars MP0 to MP3 and the memory pillars MP8 to MP11 are arranged in parallel.

The memory pillars MP4 to MP7 and MP12 to MP15 are arranged along the Y-direction. The memory pillars MP4 to MP7 are located between the memory pillars MP0 to MP3 and the memory pillars MP8 to MP11 in the X-direction. The memory pillars MP12 to MP15 are arranged along the Y-direction at positions adjacent to the memory pillars MP4 to MP7 in the X-direction. In other words, the memory pillars MP4 to MP7 and the memory pillars MP12 to MP15 are arranged in parallel.

Two bit lines BL0 and BL1 are provided above the memory pillars MP0 to MP3. The bit line BL0 is commonly connected to the memory pillars MP1, MP3. The bit line BL1 is commonly connected to the memory pillars MP0 and MP2. Two bit lines BL2 and BL3 are provided above the memory pillars MP4 to MP7. The bit line BL2 is commonly connected to the memory pillars MP5 and MP7. The bit line BL3 is commonly connected to the memory pillars MP4 and MP6.

Two bit lines BL4 and BL5 are provided above the memory pillars MP8 to MP11. The bit line BL4 is commonly connected to the memory pillars MP9 and MP11. The bit line BL5 is commonly connected to the memory pillars MP8, MP10. Two bit lines BL6 and BL7 are provided above the memory pillars MP12 to MP15. The bit line BL6 is commonly connected to the memory pillars MP13 and MP15. The bit line BL7 is commonly connected to the memory pillars MP12 and MP14.

In the present embodiment, in the Y-direction, the positions of each of the memory pillars MP0 to MP3 and MP8 to MP11 are shifted by ½ of a distance between the memory pillars MP with respect to the positions of each of the memory pillars MP4 to MP7 and MP12 to MP15.

The memory pillars MP are provided between two adjacent wiring layers 10 in the Y-direction, and are provided so as to be embedded in a part of any of the slits SLT2, and there is one slit SLT2 between the memory pillars adjacent in the Y-direction.

In addition, the memory pillar MP is not provided in a region between the wiring layers 10-0a and 10-0c adjacent to each other with the slit SLT1 interposed therebetween. However, from the viewpoint of process stability, the region may be provided with a dummy memory pillar MP which is not connected to the BL.

Figure 6:
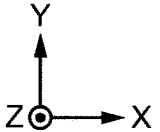
FIG. 6 is a diagram showing a layout of word lines and memory pillars of a semiconductor storage device according to an embodiment.

FIG. 6 shows a planar layout of the word lines WL in the X-Y plane, similar to FIG. 5. FIG. 6 corresponds to one block of the region of FIG. 5 and is a layout of wiring layers 11 provided in a lower layer than the wiring layer 10 described in FIG. 5.

As shown in FIG. 6, the nine wiring layers 11 (11-0a, 11-0b, and 11-1 to 11-7) extending in the X-direction are arranged along the Y-direction. Each wiring layer 11-0a, 11-0b, and 11-1 to 11-7 is provided in the lower layer of the wiring layers 10-0 to 10-7 via an insulation layer.

Each wiring layer 11 functions as a word line WL7. Other word lines WL0 to WL6 have the same configuration and function as the word line WL7. As shown in FIG. 6, the wiring layers 11-0a, 11-2, 11-4, 11-6, and 11-0b functioning as the word line WLe7 having the longitudinal in the X-direction, respectively, are arranged side by side in the Y-direction. The wiring layers 11-0a, 11-2, 11-4, 11-6, and 11-0b are connected by a first connecting section 11-8 (1st connect) having the longitudinal in the Y-direction. The first connecting section 11-8 is provided at the first end in the X-direction. The wiring layers 11-0a, 11-2, 11-4, 11-6, and 11-0b are connected to the row decoder 30 via the first connecting section 11-8. The first connecting section 11-8 and the wiring layers 11-0a, 11-2, 11-4, 11-6, and 11-0b may be collectively referred to as a wiring layers 11e.

The Wiring layers 11-1, 11-3, 11-5, and 11-7 functioning as the word line WLo7 have the longitudinal in the X-direction, respectively, and are arranged side by side in the Y-direction. These wiring layers 11-1, 11-3, 11-5, and 11-7 are connected by a second connecting section 11-9 having the longitudinal in the Y-direction. The second connecting section 11-9 (2nd connect) is provided at the second end that is an end portion opposite to a first end of the first connecting section 11-8 in the X-direction. The wiring layers 11-1, 11-3, 11-5, and 11-7 are connected to the row decoder 30 via the second connecting section 11-9. The second connecting section 11-9 and the wiring layers 11-1, 11-3, 11-5, and 11-7 may be collectively referred to as a wiring layer 11o.

The memory cell section (memory cell) is provided between the first connecting section 11-8 and the second connecting section 11-9. A portion of the memory cell section facing the wiring layer 11e is referred to as a "first memory cell section," and a portion of the memory cell section facing the wiring layer 11o may be referred to as a "second memory cell section." In the memory cell section, the wiring layers 11 adjacent to each other in the Y-direction are separated by the slit SLT2 described with reference to FIG. 5. The wiring layers 11 between the blocks BLK adjacent to each other in the Y-direction are also separated by the slit SLT1 as described in FIG. 5. In the memory cell section, the memory pillars MP0 to MP15 are provided in the same manner as in FIG. 5.

The select gate line SGS and the word lines WL0 to WL6 have the same configuration as the word line WL7 of FIG. 6.

[1-3-3. Cross-Sectional Structure of Memory Cell Array 21]

Figure 7:
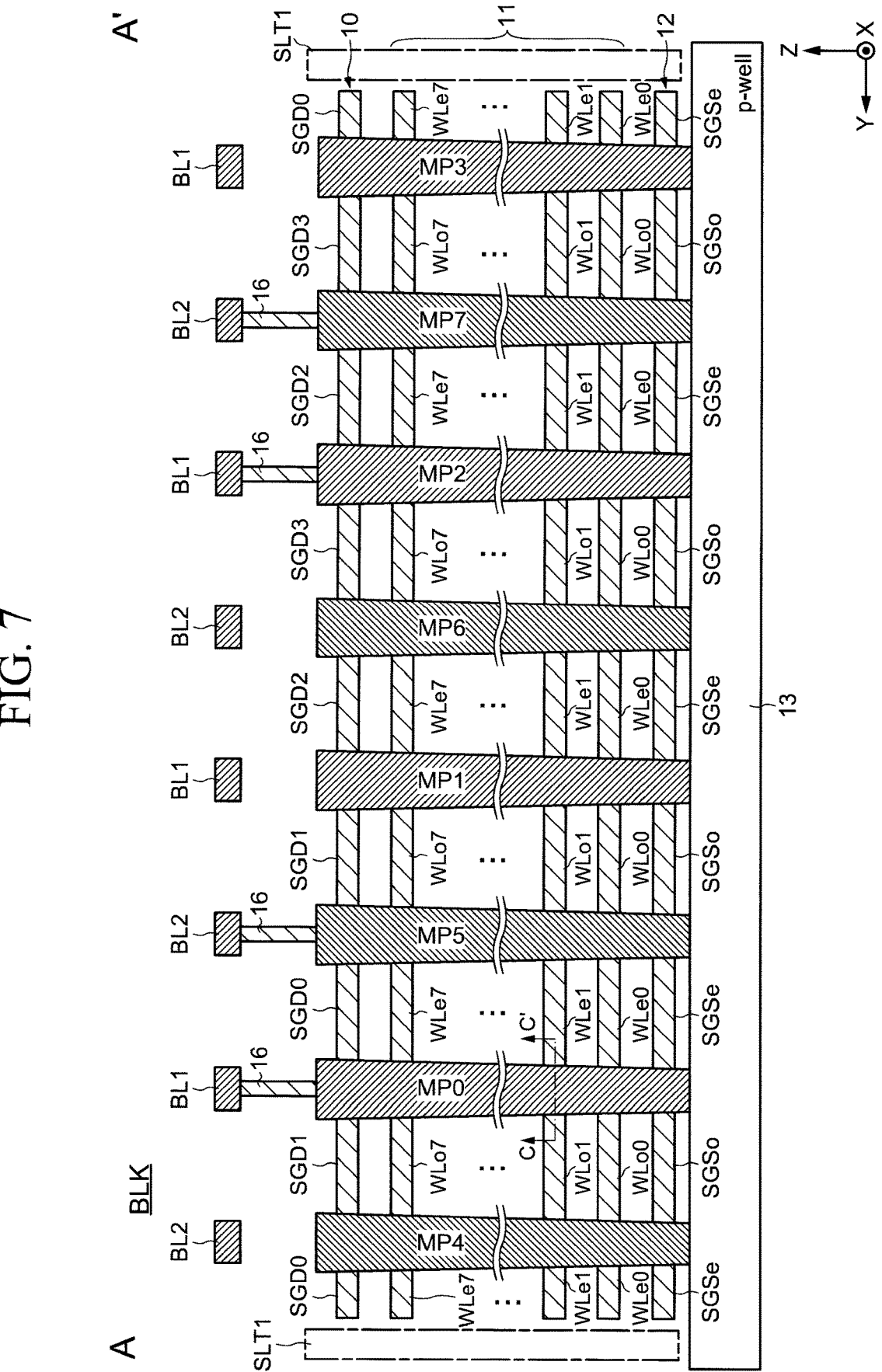
FIG. 7 is a A-A' cross-sectional view of the semiconductor storage device shown in FIG. 6.

The cross-sectional structure of the memory cell array 21 will be described with reference to FIG. 7. FIG. 7 is a A-A' cross-sectional view of the semiconductor storage device shown in FIG. 6.

As shown in FIG. 7, a wiring layer 12 functioning as the select gate line SGS is provided above a p-type well region (p-well) of a semiconductor substrate 13. Eight wiring layers 11 functioning as the word lines WL0 to WL7 are stacked along the Z-direction above the wiring layer 12. The planar layout of the wiring layers 11 and 12 is similar to the layout shown in FIG. 6. The wiring layer 10 functioning as the select gate line SGD is provided above the wiring layer 11. The planar layout of the wiring layer 10 is the layout shown in FIG. 5.

The wiring layer 12 functions as the select gate line SGSo or the select gate line SGSe. The select gate lines SGSo and SGSe are alternately arranged in the Y-direction. The memory pillar MP is provided between the select gate lines SGSo and SGSe adjacent to each other in the Y-direction.

The wiring layer 11 functions as the word line WLo or the word line WLe. The word lines WLo and WLe are alternately arranged in the Y-direction. The memory pillar MP is provided between the word lines WLo and WLe adjacent to each other in the Y-direction. A memory cell described later is provided between the memory pillar MP and the word line WLo and between the memory pillar MP and the word line WLe.

The slit SLT1 is provided between the blocks BLK adjacent to each other in the Y-direction. As described above, the slit SLT1 is provided with an insulation layer. However, a contact plug or the like for supplying a voltage to a region provided in the semiconductor substrate 13 may be provided in the slit SLT1. For example, a contact plug or a groove-shaped conductor for connecting the source of the select transistor ST2 to the source line may be provided in the slit SLT1.

In the present embodiment, the source line SL is provided on a main surface of the semiconductor substrate 13. The source line SL may have a configuration in which an unpatterned conductive layer extends to a region of the memory cell array 21, or a configuration in which a linearly patterned conductive layer extends to the region. In other words, the source line SL extends in the X-direction (first direction) and the Y-direction (second direction).

The bit lines BL1 and BL2 are provided on the memory pillar MP. A contact plug 16 for connecting each memory pillar MP and the bit line BL is provided between the memory pillar MP0 and the bit line BL1 and between the memory pillar MP2 and the bit line BL1. Similarly, the contact plug 16 for connecting each memory pillar MP and the bit line BL is provided between the memory pillar MP5 and the bit line BL2 and between the memory pillar MP7 and the bit line BL2. The other memory pillars MP are connected to the bit line BL1 or the bit line BL2 through the contact plug 16 in a region other than the cross section shown in FIG. 7.

Figure 8:
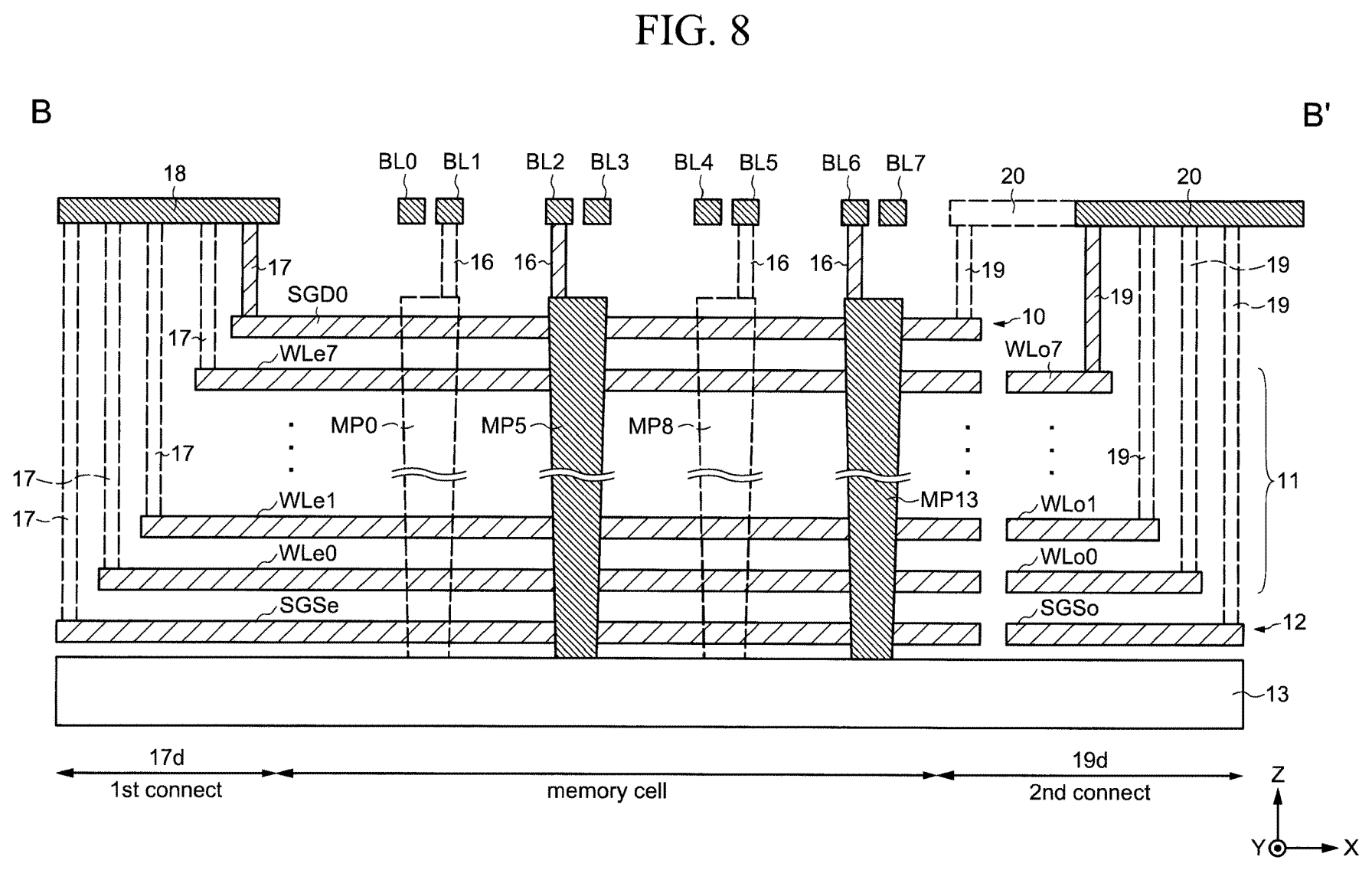

FIG. 8 is a B-B' cross-sectional view of the semiconductor storage device shown in FIG. 6. As described in an explanation of FIG. 7, the wiring layers 12, 11, and 10 are provided sequentially above the semiconductor substrate 13. In FIG. 8, the configuration existing in the depth direction of the B-B' cross-sectional view is drawn by a dotted line.

In a first connecting section 17d (1st connect), the wiring layers 11 and 12 are formed in a stepped shape. That is, when viewed in the X-Y plane, each of end portions of the eight wiring layers 11 and an upper surface of an end portion of the wiring layer 12 are exposed in the first connecting section 17d. A contact plug 17 is provided in the wiring layers 11 and 12 exposed at the first connecting section 17d. The contact plug 17 is connected to a metal wiring layer 18. The wiring layers 10 to 12 functioning as even select gate lines SGD0, SGD2, SGD4, SGD6, an even word line WLe, and an even select gate line SGSe are electrically connected to the row decoder 30 via the metal wiring layer 18.

In a second connecting section 19d (2nd connect), similar to the above, the wiring layers 11, 12 are formed in a stepped shape. That is, when viewed in the X-Y plane, each end portion of the eight wiring layers 11 and the upper surface of the end portion of the wiring layer 12 are exposed in the second connecting section 19d. A contact plug 19 is provided in the wiring layers 11 and 12 exposed at the second connecting section 19d. The contact plug 19 is connected to a metal wiring layer 20. The wiring layers 11 and 12 functioning as odd select gate lines SGD1, SGD3, SGD5, SGD7, an odd word line WLo, and an odd select gate line SGSo are electrically connected to the row decoder 30 via the metal wiring layer 20.

The wiring layer 10 may be electrically connected to the row decoder 30 via the second connecting section 19d instead of the first connecting section 17d, and may be electrically connected to the row decoder 30 via both the first connecting section 17d and the second connecting section 19d.

Although the details will be described later, string select lines STR_SEL0 and STR_SEL1 are provided between the select gate line SGS and the word line WL0 in the present embodiment. However, the string select lines STR_SEL0 and STR_SEL1 are omitted in FIG. 7 and FIG. 8 for convenience of explanation.

1-4. Structure of Memory Pillar and Memory Cell Transistor

Structures of the memory pillar MP and the memory cell transistor MT will be described with reference to FIG. 9 and FIG. 10.

1-4-1. First Example

The configurations of the memory pillar MP and the memory cell transistor MT according to a first example will be described with reference to FIG. 9 and FIG. 10. FIG. 9 is a C-C' cross-sectional view of the memory cell shown in FIG. 7. FIG. 10 is a D-D' cross-sectional view of the memory cell shown in FIG. 9. In the first example, a floating gate type memory cell transistor MT is shown in which a conductive layer is used as the charge storage layer of the memory cell transistor MT.

Figure 9:
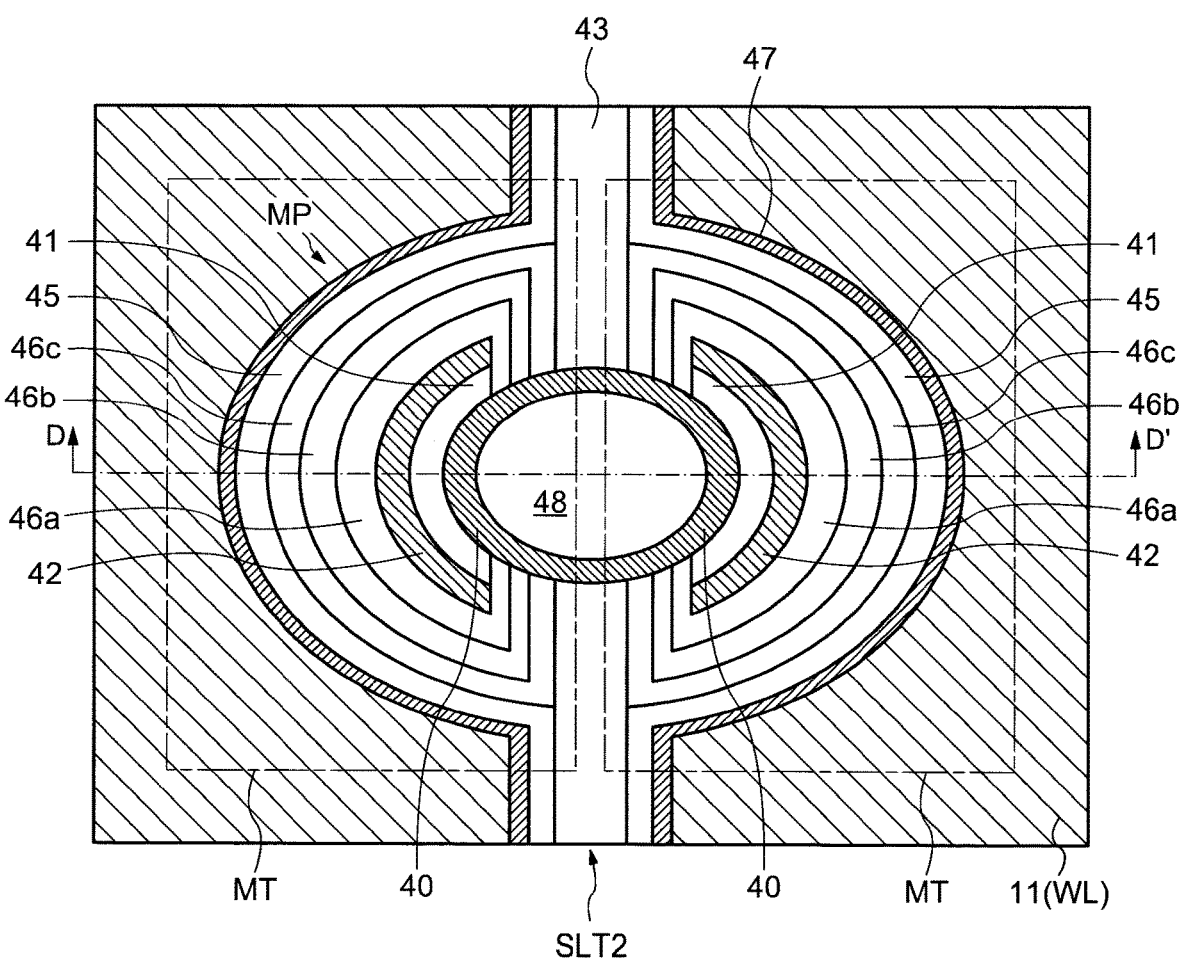
FIG. 9 is a C-C' cross-sectional view of the memory cell shown in FIG. 7.
Figure 9:
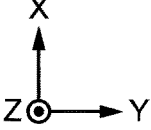
Figure 10:
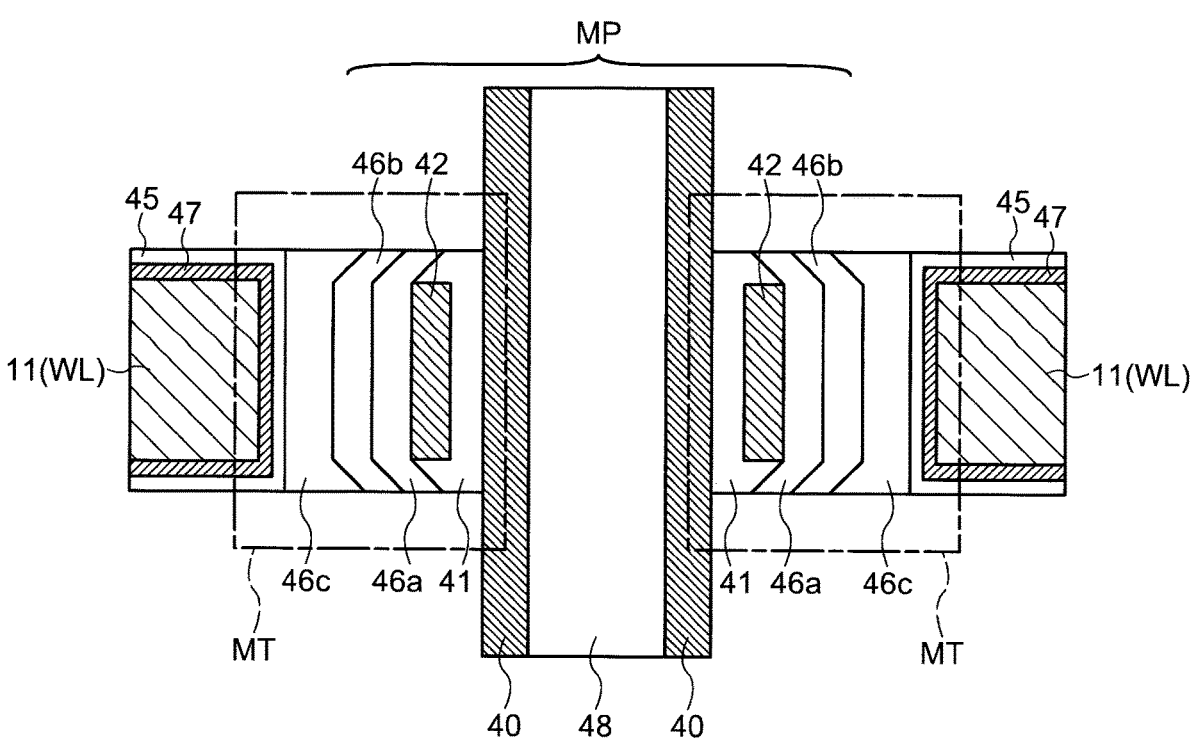
FIG. 10 is a D-D' cross-sectional view of the memory cell shown in FIG. 9.
Figure 10:
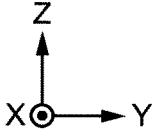

As shown in FIG. 9 and FIG. 10, the memory pillars MP include insulation layers 48, 43, a semiconductor layer 40, an insulation layer 41, a conductive layer 42, and insulation layers 46a to 46c provided along the Z-direction. The insulation layer 48 is, for example, a silicon oxide layer. The semiconductor layer 40 is provided to surround the periphery of the insulation layer 48. The semiconductor layer 40 is, for example, a polycrystalline silicon layer. The semiconductor layer 40 functions as a channel of the memory cell transistor MT. The semiconductor layer 40 is provided continuously between the two memory cell transistors MT included in one memory pillar MP and is not separated for each memory cell transistor MT.

As described above, the semiconductor layer 40 is continuous between the two memory cell transistors MT facing each other. Therefore, two channels formed in the two memory cell transistors MT share a part of the memory pillar MP. Specifically, in FIG. 9, in the memory cell transistor MT on the left side and the memory cell transistor MT on the right side facing each other, the channel formed in the memory cell transistor MT on the left side and the channel formed in the memory cell transistor MT on the right side share a part of the memory pillar MP. The two channels share a part of the memory pillar MP means that the two channels are formed in the same memory pillar MP and that the two channels partially overlap. The above configuration may be referred to as that the two memory cell transistors MT share the channel or the two memory cell transistors MT face each other.

The insulation layer 41 is provided around the semiconductor layer 40 and functions as a gate insulation layer of each memory cell transistor MT. The insulation layer 41 is separated into two regions in the X-Y plane shown in FIG. 9. Each of the insulation layers 41 functions as the gate insulation layer of the two memory cell transistors MT included in one memory pillar MP. The insulation layer 41 is, for example, a stacked structure of the silicon oxide layer and the silicon nitride layer. The conductive layer 42 is provided around the insulation layer 41 and is separated into two regions along the Y-direction by the insulation layer 43. The conductive layer 42 is, for example, a polycrystalline silicon layer having conductivity. Each of the separated conductive layers 42 functions as the charge storage layer of the two memory cell transistors MT described above.

The insulation layer 43 is, for example, a silicon oxide layer. The insulation layers 46a, 46b, and 46c are provided sequentially around the conductive layer 42. The insulation layers 46a and 46c are, for example, silicon oxide layers. The insulation layer 46b is, for example, a silicon nitride layer. The insulation layers function as block insulation layers of the memory cell transistor MT. The insulation layers 46a to 46b are also separated into two regions along the Y-direction. The insulation layer 43 is provided between the separated insulation layers 46a to 46b. The insulation layer 43 is embedded in the slit SLT2. The insulation layer 43 is, for example, a silicon oxide layer.

An AlO layer 45 is provided around the memory pillar MP having the configuration described above, for example. A barrier metal layer 47 (TiN layer or the like) is provided around the AlO layer 45, for example. The wiring layer 11 functioning as the word line WL is provided around the barrier metal layer 47. The wiring layer 11 is, for example, tungsten.

According to the above configuration, two memory cell transistors MT are provided in one memory pillar MP along the Y-direction. The select transistors ST1 and ST2 also have the same configuration as described above. An insulation layer (not shown) is provided between the memory cell transistors adjacent to each other in the Z-direction. The conductive layer 42 is insulated for each individual memory cell transistor by the insulation layer and the insulation layers 43 and 46.

1-4-2. Example 2

Figure 11:
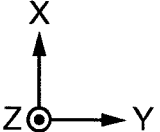
FIG. 11 is a modification of the memory cell shown in FIG. 9.
Figure 12:
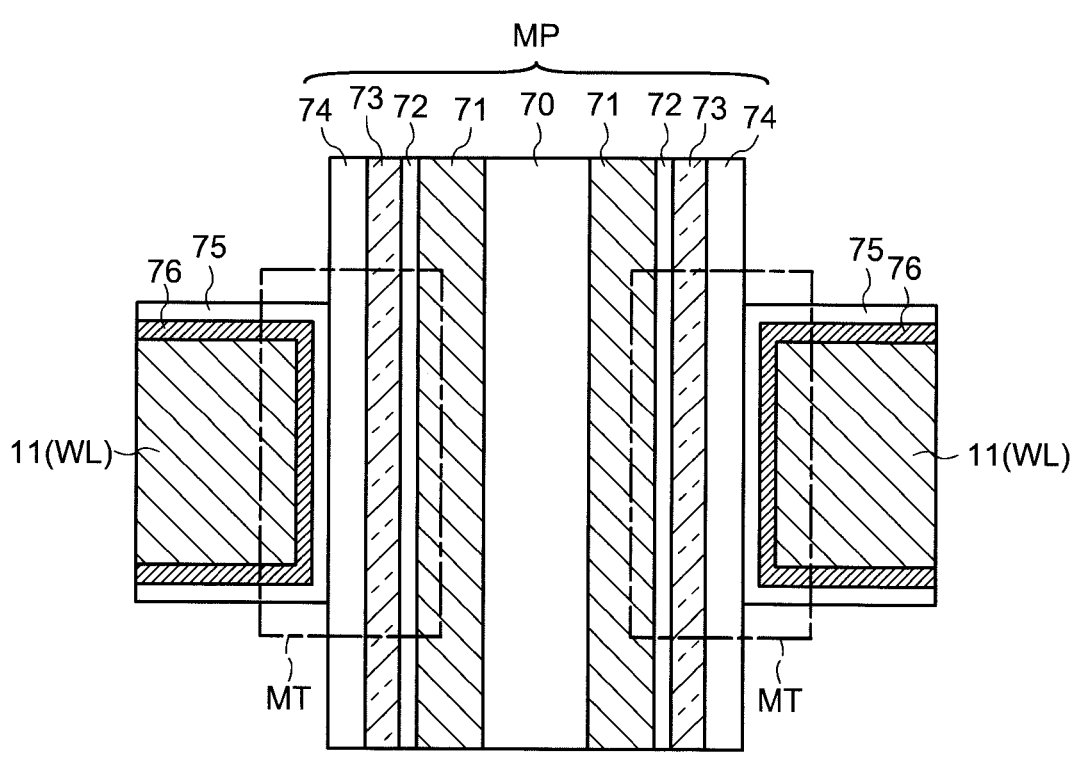
FIG. 12 is an E-E' cross-sectional view of the memory cell shown in FIG. 11.
Figure 12:
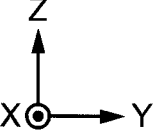

The configurations of the memory pillar MP and the memory cell transistor MT according to a second example will be described with reference to FIG. 11 and FIG. 12. FIG. 11 is a modification of the memory cell shown in FIG. 9. FIG. 12 is an E-E' cross-sectional view of the memory cell shown in FIG. 11. In the second example, a MONOS type memory cell transistor MT in which an insulation layer is used in the charge storage layer of the memory cell transistor MT is shown.

As shown in FIG. 11 and FIG. 12, the memory pillar MP includes an insulation layer 70, a semiconductor layer 71, and insulation layers 72 to 74 provided along the Z-direction. The insulation layer 70 is, for example, a silicon oxide layer. The semiconductor layer 71 is provided to surround the periphery of the insulation layer 70. The semiconductor layer 71 functions as the channel of the memory cell transistor MT. The semiconductor layer 71 is, for example, a polycrystalline silicon layer. The semiconductor layer 71 is continuously provided between the two memory cell transistors MT included in one memory pillar MP. Therefore, the channels formed in each of the two memory cell transistors MT share a part of the memory pillar MP.

The insulation layer 72 is provided to surround the semiconductor layer 71, and functions as the gate insulation layer of the memory cell transistor MT. The insulation layer 72 is, for example, a stacked structure of a silicon oxide layer and a silicon nitride layer. The insulation layer 73 is provided to surround the periphery of the semiconductor layer 71 and functions as the charge storage layer of the memory cell transistor MT. The insulation layer 73 is, for example, a silicon nitride layer. The insulation layer 74 is provided to surround the periphery of the insulation layer 73 and functions as the block insulation layer of the memory cell transistor MT. The insulation layer 74 is, for example, a silicon oxide layer. An insulation layer 77 is embedded in the slit SLT2 except for the memory pillar MP portion. The insulation layer 77 is, for example, a silicon oxide layer.

For example, an AlO layer 75 is provided around the memory pillar MP having the configuration described above. For example, a barrier metal layer 76 (TiN layer or the like) is provided around the AlO layer 75. The wiring layer 11 functioning as the word line WL is provided around the barrier metal layer 76. The wiring layer 11 is, for example, tungsten.

In accordance with the configuration described above, two memory cell transistors MT are provided in one memory pillar MP along the Y direction. The select transistors ST1 and ST2 have the same configuration as described above.

1-5. Equivalent Circuit

Figure 13:
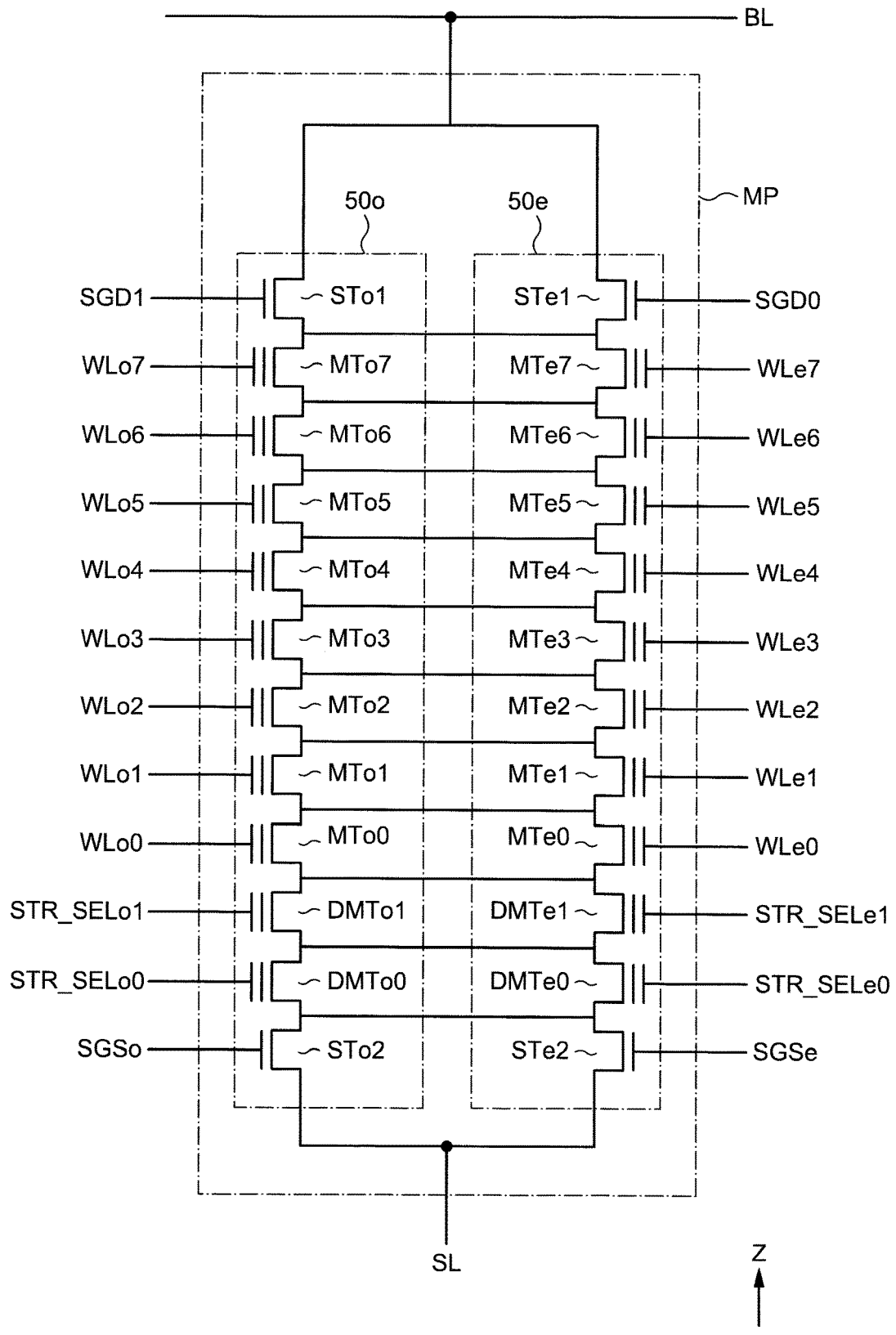
FIG. 13 is a diagram showing an equivalent circuit of adjacent strings in a semiconductor memory device according to an embodiment.

FIG. 13 is a diagram showing an equivalent circuit of adjacent strings in a semiconductor memory device according to an embodiment. As shown in FIG. 13, the two NAND strings 50o and 50e are formed in one memory pillar MP. Specifically, the NAND string 50o (first string) is provided on a first side of the memory pillar MP. The NAND string 50e (second string) is provided on a second side of the memory pillar MP.

In the following explanation, for example, in the case where the NAND strings 50o and 50e do not need to be distinguished, they are simply referred to as the "NAND strings 50." Members included in NAND string 50 and wirings connected to the members are also expressed in the same manner as described above. For example, in the case where the memory cell transistors MTo and MTe do not need to be distinguished, they are simply referred to as the "memory cell transistors MT." Similarly, in the case where the string select lines STR_SELo and STR_SELe do not need to be distinguished, they are simply referred to as the "string select lines STR_SEL."

The NAND string 50o (first string) includes a select transistor STo1 (first transistor), i (i is an integer number of 2 or more) memory cell transistors MTo (first memory cell), j (j is an integer number of 1 or more) memory cell transistors DMTo (second memory cell), and a select transistor STo2, which are electrically connected in series. In this embodiment, the i is 8 and the j is 2. The i memory cell transistors MTo0 to MTo7 are provided between the memory cell transistor DMTo1 closest to the select transistor STo1 in the j memory cell transistors DMTo0 to DMTo1 and the select transistor STo1.

The NAND string 50e (second string) includes the select transistor STe1 (second transistor), i memory cell transistors MTe (third memory cell), j memory cell transistors DMTe (fourth memory cell), and the select transistor STe2, which are electrically connected in series. The i memory cell transistors MTe0 to MTe7 are provided between the memory cell transistor DMTe1 closest to the select transistor STe1 in the j memory cell transistors DMTe0 to DMTe1 and the select transistor STe1.

The select gate lines SGSo and SGSe which are provided in one layer, the string select lines STR_SELo and STR_SELe which are provided in the j layer(s), the word lines WLo (first word line) and the word line WLe (second word line) which are provided in the i layers, and select gate lines SGD0 and SGD1 which are provided in one layer are provided in a Z direction (third direction) with respect to the source line SL. In the present embodiment, the j is 2, and string select lines STR_SELo0 to STR_SELo1 and string select lines STR_SELe0 to STR_SELe1 are provided. In the present embodiment, the i is 8, and word lines WLo0 to WLo7 and word lines WLe0 to WLe7 are provided.

In the present embodiment, although the configuration in which each of the select gate lines SGSo and SGSe and each of the select gate lines SGD0 and SGD1 are one layer is shown, the configuration is not limited to this configuration. For example, each of the select gate lines SGSo and SGSe and each of the select gate lines SGD0 and SGD1 may be two or more layers. The number of layers of the select gate lines SGSo and SGSe may be different from the number of layers of the select gate lines SGD0 and SGD1.

The word lines WLo0 to WLo7 (first word lines) are provided in the Z direction with respect to the string select line STR_SELo, and are stacked in the Z direction. The word lines WLe0 to WLe7 (second word lines) are provided in the Z direction with respect to the string select line STR_SELe, and are stacked in the Z direction. Positions of the word lines WLo0 to WLo7 are the same as positions of the word lines WLe0 to WLe7 in the Z direction. For example, in the Z direction, a position of the word line WLo0 is the same as a position of the word line WLe0, and a position of the word line WLo7 is the same as a position of the word line WLe7. In other words, the word line WLo0 is the same layer as the word line WLe0, and the word line WLo7 is the same layer as the word line WLe7. In other words, the word line WLo0 and the word line WLe0 are in contact with the same layer or a common layer. Similarly, the word line WLo7 and the word line WLe7 are in contact with the same layer or the common layer.

The select gate lines SGD0 and SGD1 are provided in the Z direction with respect to the word line WLo and the word line WLe. In FIG. 13, although only the select gate lines SGD0 and SGD1 are shown, the select gate lines SGD are separated into 2n (n is an integer number of 1 or more) on a plane extending in the X direction (first direction) and the Y direction (second direction). In the present embodiment, the n is 2, and as shown in FIG. 5, four separated select gate lines SGD0 to SGD3 are provided. The select gate lines SGD0 to SGD3 are independently controlled.

In other words, referring to FIG. 5 and FIG. 6, the memory pillar MP is provided between the word line WLo (first word line) and the word line WLe (second word line) and between the opposing select gate lines SGD (SGD0 and SGD1 in FIG. 13) of the 2n select gate lines SGD. The plurality of memory pillars MP extend in the Z direction. The plurality of memory pillars MP are electrically connected to the source line SL and the bit line BL.

The select transistor STo1 (first transistor) is connected to the select gate line SGD1. The select transistor STe1 (second transistor) is connected to the select gate line SGD0. That is, the select transistor ST1 is connected to one of the select gate lines SGD among the 2n select gate lines SGD0 to SGD3. The i memory cell transistors MTo0 to MTo7 (first memory cells) are electrically connected in series as described above, are arranged along the Z direction, and are connected to the i layer word lines WLo0 to WLo7 (first word lines), respectively. Similarly, the i memory cell transistors MTe0 to MTe7 (third memory cells) are electrically connected in series as described above, are arranged along the Z direction, and are connected to the i layer word lines WLe0 to WLe7 (second word lines), respectively. The i memory cell transistors MTo0 to MTo7 (first memory cells) and the i memory cell transistors MTe0 to MTe7 (third memory cells) share a semiconductor layer.

Sources of the opposing select transistor STo1 (first transistor) and STe1 (second transistor) are electrically connected to each other. Similarly, drains of the opposing select transistors STo1 (first transistor) and STe1 (second transistor) are electrically connected to each other. Sources of the memory cell transistors MTo0 to MTo7 (first memory cells) and MTe0 to MTe7 (second memory cell) that face each other are electrically connected to each other. Similarly, drains of the memory cell transistors MTo0 to MTo7 (first memory cells) and MTe0 to MTe7 (second memory cells) that face each other are electrically connected to each other. Sources of the memory cell transistors DMTo0 to DMTo1 (second memory cells) and DMTe0 to DMTe1 (fourth memory cells) that face each other are electrically connected to each other. Similarly, drains of the memory cell transistors DMTo0 to DMTo1 (second memory cells) and DMTe0 to DMTe1 (fourth memory cells) that face each other are electrically connected to each other. Sources of the opposing select transistors STo2 and STe2 are electrically connected to each other. Similarly, drains of the opposing select transistors STo2 and STe2 are electrically connected to each other. This is due to the fact that channels formed in the opposing transistors share the semiconductor layer of the memory pillar MP.

In the present embodiment, a position of the first (#1) word line WLo0 among the eight layer word lines WLo0 to WLo7 (first word lines) is closest to a position of the source line SL, and a position of the eighth (#8) word line WLo7 is farthest from the position of the source line SL. Similarly, a position of the first (#1) word line WLe0 among the eight layer word lines WLe0 to WLe7 (the second word lines) is closest to the position of the source line SL, and a position of the eighth (#8) word line WLe7 is farthest from the position of the source line SL.

In the case where a read operation is performed, the select transistor ST1 belonging to the NAND string 50 to be read is in an on-state, and other select transistors ST1 are in an off-state. For example, in the case where the read operation is performed on the memory cell transistor MTo2 of the NAND string 50o, a read voltage VCGRV for data stored in the memory cell transistor MT is supplied to the word line WLo2, and a read voltage VREAD for forcibly turning the memory cell transistor MT to the on-state is supplied to the other word lines WL.

In this case, in the "other" NAND string 50o connected to the word line WLo2, both the memory cell transistor MTo2 connected with the word line WLo2 and the select transistor ST1 connected with the select gate line SGD1 are in the off-state, therefore a potential between these transistors is floating. In this condition, when a high voltage is supplied to the word lines WLo3 to WLo7 connected to the memory cell transistors MTo3 to MTo7 provided between the select transistor ST1 and the memory cell transistor MTo2 which are in the off-state, the floating potential is raised (boosted), and erroneous writing (read disturb) may occur due to the effect.

In order to suppress the read disturb, the voltage VREAD and a voltage VSG are respectively supplied to all the word lines WL and the select gate lines SGD at the beginning of the read operation. Through this operation, VSS (for example, 0 V) is supplied to channels of the memory cell transistors MT formed in the memory pillar MP. This operation is called a channel clean operation. However, in the channel clean operation, since capacitance between all the memory pillars MP and the word lines WL is charged, there is a problem that power consumption is large. Therefore, a countermeasure for boosting the entire NAND strings 50 by turning the memory cell transistors DMT belonging to the NAND strings 50 not to be read to the off-state, in which the select transistor ST1 is in the off-state, has been studied. With such an operation, capacitance between the memory pillar MP of the unselected strings and the word lines WL is not charged, so that the power consumption can be reduced. This countermeasure requires the same number of memory cell transistors DMT as the number of select gate lines SGD that control the select transistor ST.

1-6. Memory Pillar Group MPGR

Figure 14:
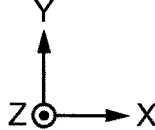
FIG. 14 is a diagram showing a memory pillar group in a semiconductor memory device according to an embodiment.

FIG. 14 is a diagram showing a memory pillar group in a semiconductor memory device according to an embodiment. In the present embodiment, the memory pillars MP arranged in the X direction is defined as one row. In this case, five rows of memory pillars MP arranged side by side in the Y direction are defined as one memory pillar group MPGR. Specifically, a memory pillar group MPGR0 includes the memory pillars MP4 and MP12 in a first row, the memory pillars MP0 and MP8 in a second row, the memory pillars MP5 and MP13 in a third row, the memory pillars MP1 and MP9 in a fourth row, and the memory pillars MP3 and MP11 in an eighth row. A memory pillar group MPGR1 includes the memory pillars MP1 and MP9 in the fourth row, the memory pillars MP6 and MP14 in a fifth row, the memory pillars MP2 and MP10 in a sixth row, the memory pillars MP7 and MP15 in a seventh row, and the memory pillars MP3 and MP11 in the eighth row.

The memory pillar groups MPGR0 and MPGR1 share the memory pillars MP1 and MP9 in the fourth row and the memory pillars MP3 and MP11 in the eighth row. The memory pillars MP4 and MP12 in the first row, the memory pillars MP0 and MP8 in the second row, and the memory pillars MP5 and MP13 in the third row sandwiched between the select gate lines SGD0 and SGD1 are memory pillars MP unique to the memory pillar group MPGR0. The memory pillars MP6 and MP14 in the fifth row, the memory pillars MP2 and MP10 in the sixth row, and the memory pillars MP7 and MP15 in the seventh row sandwiched between the select gate lines SGD2 and SGD3 are memory pillars MP unique to the memory pillar group MPGR1.

As will be described later, each of the memory pillar groups MPGR is controlled during the read operation. Specifically, the memory pillar groups MPGR including the memory pillars MP that are the targets of the read operation are selected, the NAND strings 50 included in the memory pillar groups MPGR becomes conductive state, and the NAND string 50 not included in the memory pillar groups MPGR becomes non-conductive state by controlling the memory cell transistors DMT. It is possible to suppress generation of read disturbance in the memory cell transistors MT belonging to the NAND strings 50 included in the unselected memory pillar groups MPGR by the read operation.

1-7. Threshold Distribution of Memory Cell Transistor

Figure 15:
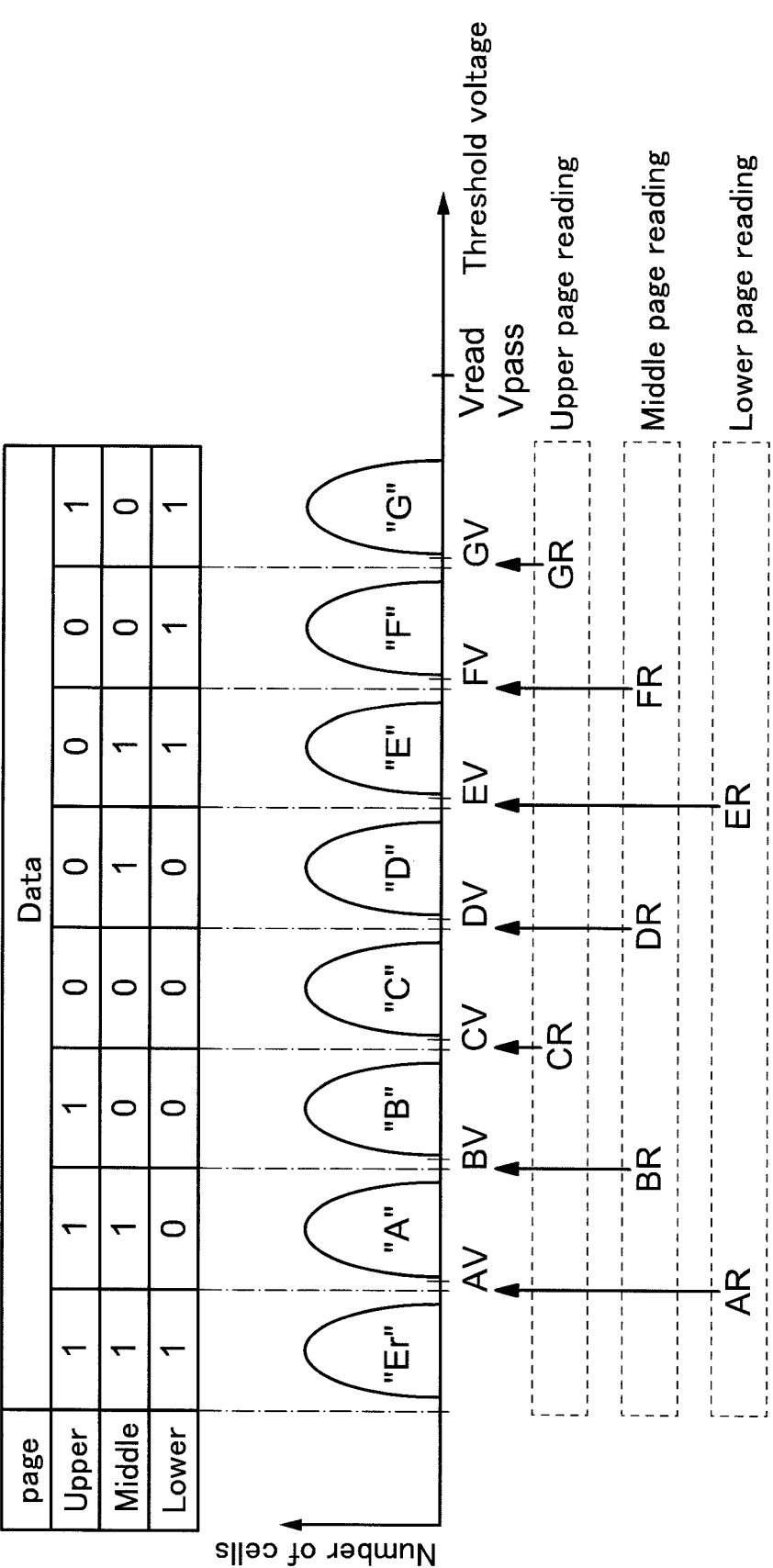
FIG. 15 is a diagram showing a threshold distribution of a memory cell transistor according to an embodiment.

Prior to describing the read operation in the present embodiment, a threshold state of the memory cell transistors MT and DMT will be described. FIG. 15 is a diagram showing a threshold distribution of a transistor (memory cell transistor) used as a memory cell according to an embodiment. In FIG. 15, Triple Level Cell (TLC) will be described as an exemplary threshold value of the memory cell transistor. However, Quad Level Cell (QLC), Multi Level Cell (MLC), and Single Level Cell (SLC) may be used in a memory system 1.

FIG. 15 shows an example of a threshold distribution, a data allocation, a read voltage, and a verify voltage of a memory cell transistor. The vertical axis of the threshold distribution shown in FIG. 15 corresponds to the number of memory cell transistors (Number of cells), and the horizontal axis corresponds to a threshold voltage Vth of the memory cell transistor.

As shown in FIG. 15, the plurality of memory cell transistors form eight threshold distributions in the TLC method. The eight threshold distributions may be referred to as write levels. The write level is referred to as "Er" level, "A" level, "B" level, "C" level, "D" level, "E" level, "F" level, and "G" level in order from the lowest threshold voltage. For example, different 3-bit data as shown below is allocated to these write levels. This 3-bit data is referred to as a low-order bit (Lower), a medium-order bit (Middle), and a high-order bit (Upper).

A set of Lower bits held by memory cell transistors connected to the same word line is referred to as a Lower page, a set of Middle bits is referred to as a Middle page, and a set of Upper bits is referred to as an Upper page. A data write operation and a data read operation are performed on a page-by-page manner.

"Er" level: "111" data
"A" level: "110" data
"B" level: "100" data
"C" level: "000" data
"D" level: "010" data
"E" level: "011" data
"F" level: "001" data
"G" level: "101" data The data described above are written in an order of Upper, Middle, and Lower.

Verify voltages used in each write operation are set between adjacent threshold distributions. Specifically, verify voltages AV, BV, CV, DV, EV, FV, and GV are respectively set corresponding to the "A" level, the "B" level, the "C" level, the "D" level, the "E" level, the "F" level, and the "G" level.

For example, the verify voltage AV is set between a maximum threshold voltage in the "Er" level and a minimum threshold voltage in the "A" level. When the verify voltage AV is applied to the memory cell transistors, memory cell transistor whose threshold voltage is included at the "Er" level is in the on-state, and memory cell transistor whose threshold voltage is included in the "A" level or higher is in the off-state.

The other verify voltages BV, CV, DV, EV, FV, and GV are also set in the same manner as the verify voltage AV. The verify voltage BV is set between the "A" level and the "B" level. The verify voltage CV is set between the "B" level and the "C" level. The verify voltage DV is set between the "C" level and the "D" level. The verify voltage EV is set between the "D" level and the "E" level. The verify voltage FV is set between the "E" level and the "F" level. The verify voltage GV is set between the "F" level and the "G" level.

For example, the verify voltage AV may be set to 0.8 V, the verify voltage BV may be set to 1.6 V, the verify voltage CV may be set to 2.4 V, the verify voltage DV may be set to 3.1 V, the verify voltage EV may be set to 3.8 V, the verify voltage FV may be set to 4.6 V, and the verify voltage GV may be set to 5.6 V. However, the verify voltages AV to GV are not limited to the voltage described above. For example, the verify voltages AV to GV may be set in stages as appropriate within 0.0 V to 7.0 V.

A read voltage used in each read operation is set between adjacent threshold distributions. For example, a read voltage AR for determining whether the threshold voltage of the memory cell transistor is included in the "Er" level or the "A" level or higher is set between the maximum threshold voltage in the "Er" level and the minimum threshold voltage in the "A" level.

Other read voltages BR, CR, DR, ER, FR, and GR are also set between adjacent levels, similar to the read voltage AR. For example, the read voltage BR is set between the "A" level and the "B" level. The read voltage CR is set between the "B" level and the "C" level. The read voltage DR is set between the "C" level and the "D" level. The read voltage ER is set between the "D" level and the "E" level. The read voltage FR is set between the "E" level and the "F" level. The read voltage GR is set between the "F" level and the "G" level.

The voltage VREAD applied to an unselected WL at the time of reading is set to a voltage value higher than the highest threshold voltage of the highest threshold distribution (for example, the "G" level). A memory cell transistor in which VREAD is applied to a gate is turned to the on-state regardless of data to be stored.

The verify voltages AV, BV, CV, DV, EV, FV, and GV are respectively set to voltages higher than the read voltages AR, BR, CR, DR, ER, FR, and GR. That is, the verify voltages AV to GV are respectively set near lower tails of the threshold distributions of "A" level, "B" level, "C" level, "D" level, "E" level, "F" level, and "G" level.

For example, a select voltage VSEL used in the following explanation is a voltage for controlling the memory cell transistor MT in the "Er" level to be in the on-state and the memory cell transistor MT in the "D" level to be in the off-state.

1-8. Read Operation

With reference to FIG. 16 to FIG. 19, a read operation of the memory cell included in the block BLK shown in FIG. 14 will be described. The following read operation is executed by a control circuit provided in the memory controller 2. As shown in FIG. 16 to FIG. 19, the memory pillars MP0 to MP15 are classified into four types.

Figure 16:
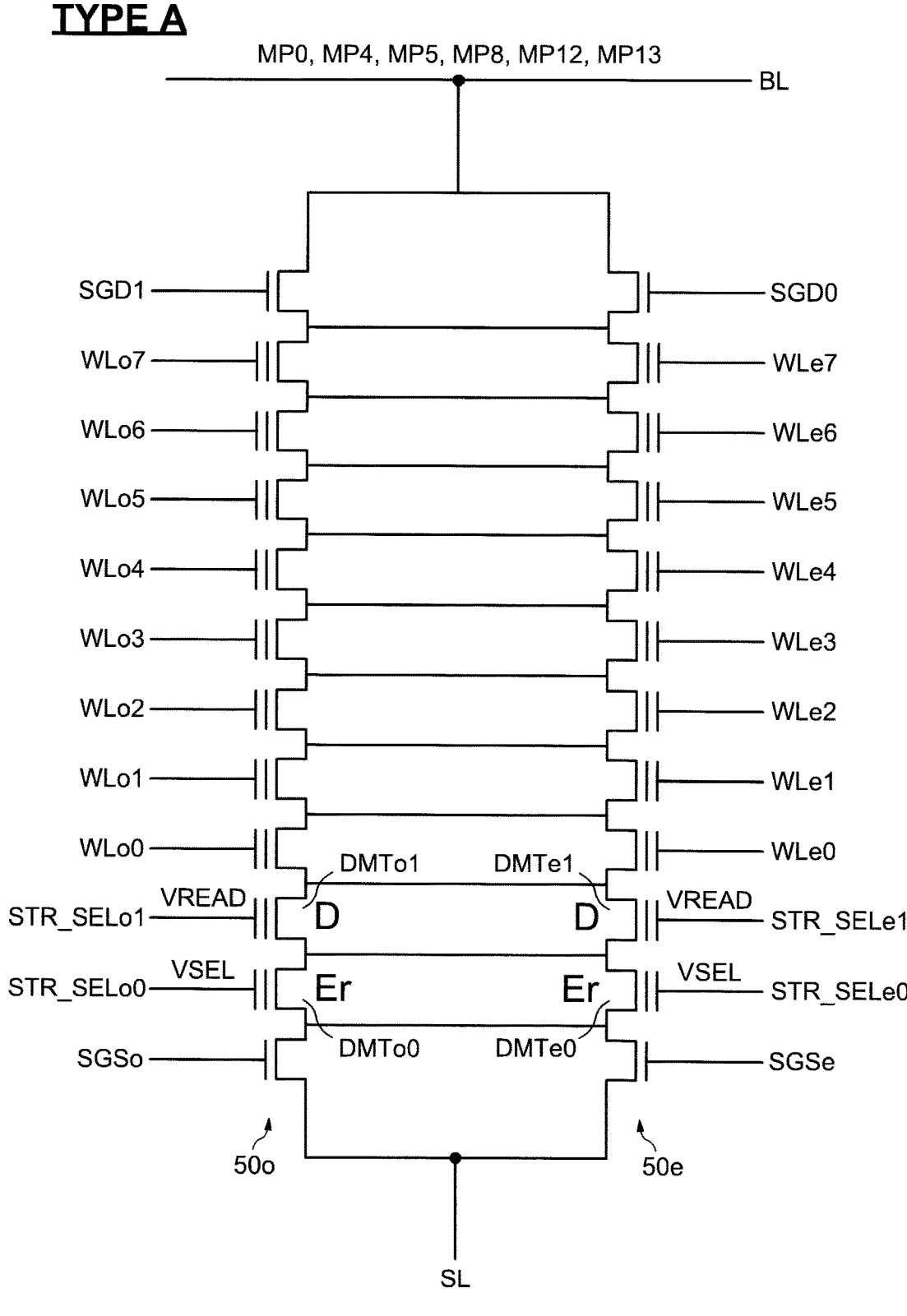
FIG. 16 is an equivalent circuit diagram showing a read operation of a semiconductor memory device according to an embodiment.
Figure 17:
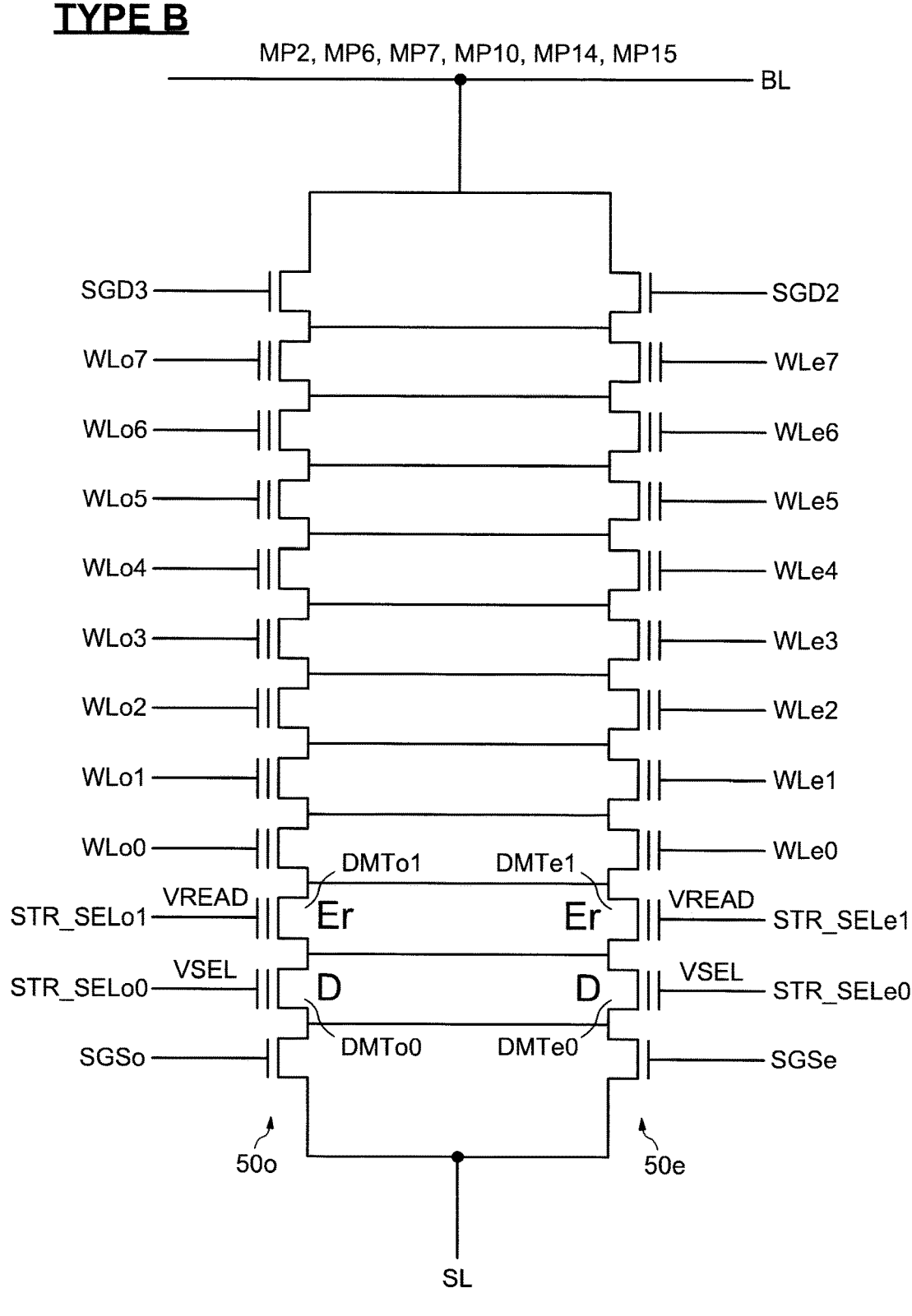
FIG. 17 is an equivalent circuit diagram showing a read operation of a semiconductor memory device according to an embodiment.
Figure 18:
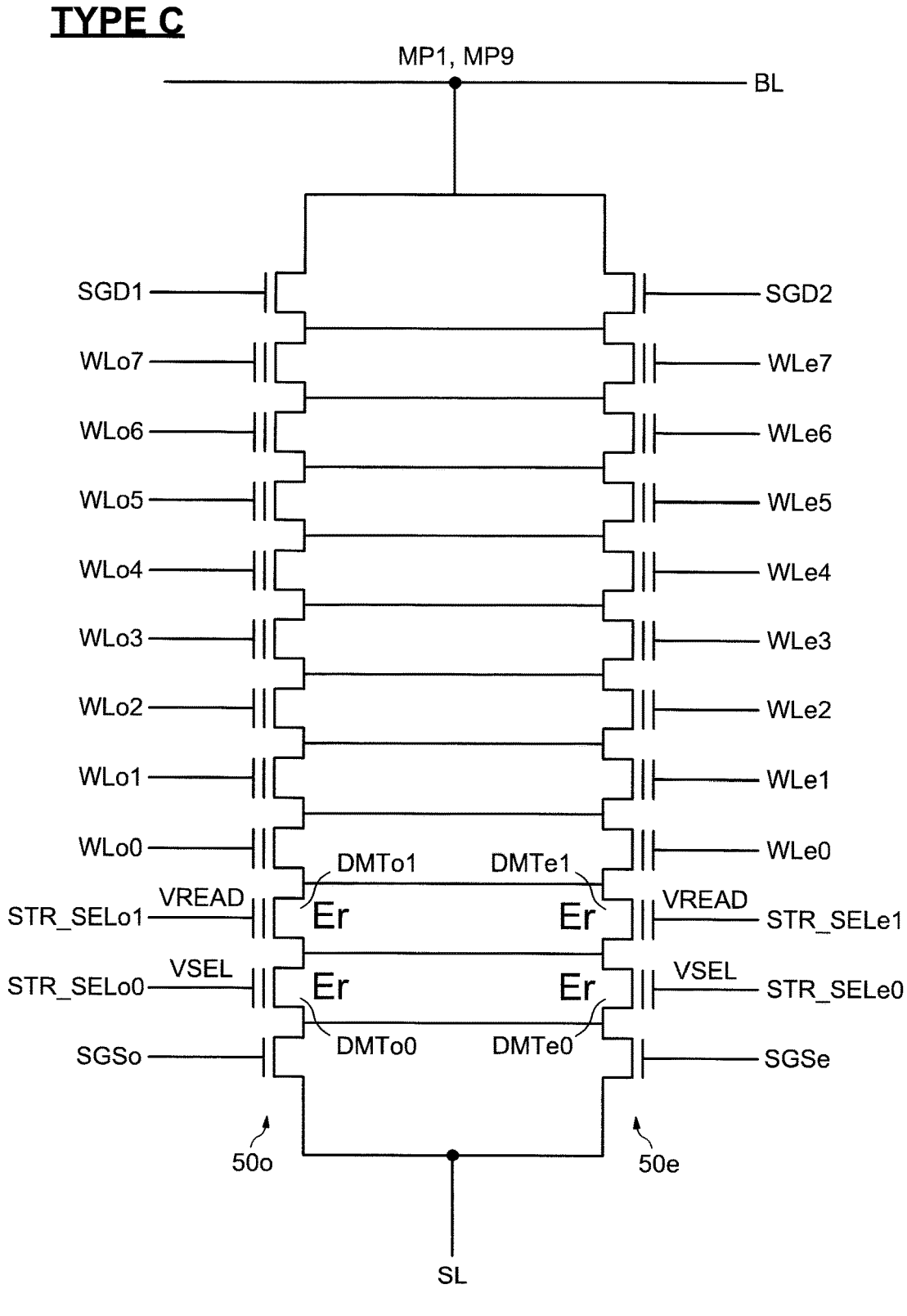
FIG. 18 is an equivalent circuit diagram showing a read operation of a semiconductor memory device according to an embodiment.
Figure 19:
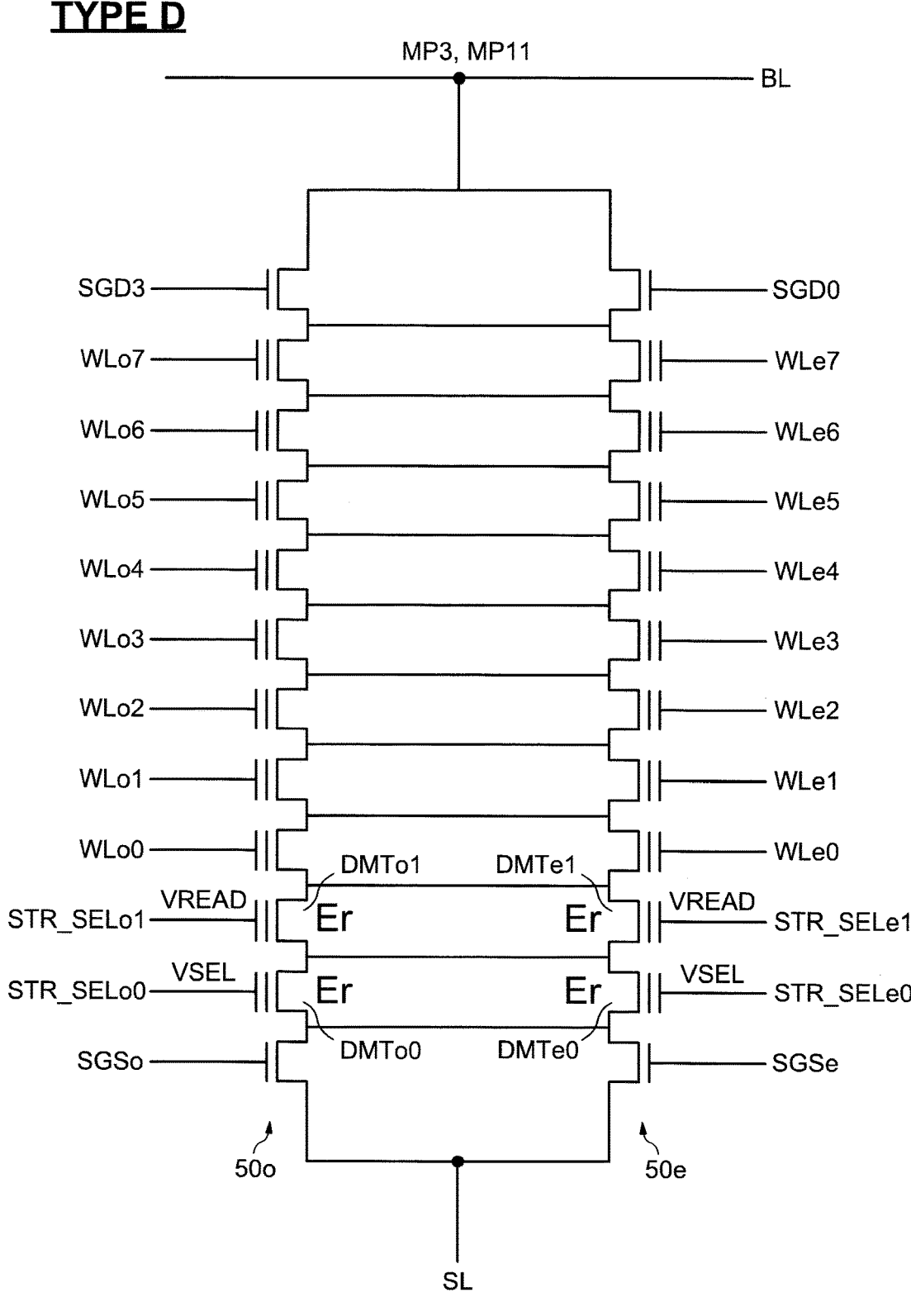
FIG. 19 is an equivalent circuit diagram showing a read operation of a semiconductor memory device according to an embodiment.

As shown in FIG. 16, the memory pillars MP0, MP4, MP5, MP8, MP12, and MP13 are classified as type-A. The memory pillars MP classified as type-A are the memory pillars MP sandwiched between the select gate lines SGD0 and the SGD1. As shown in FIG. 17, the memory pillars MP2, MP6, MP7, MP10, MP14, and MP15 are classified as type-B. The memory pillars MP classified as type-B are the memory pillars MP sandwiched between the select gate lines SGD2 and SGD3. As shown in FIG. 18, the memory pillars MP1 and MP9 are classified as type-C. The memory pillars MP classified as type-C are the memory pillars MP sandwiched between the select gate lines SGD1 and the SGD2. As shown in FIG. 19, the memory pillars MP3 and MP11 are classified as type-D. The memory pillars MP classified as type-D are the memory pillar MP sandwiched between the select gate lines SGD0 and SGD3.

As shown in FIG. 16, in the type-A, the memory cell transistors DMTo0 and DMTe0 are set to the "Er" level, and the memory cell transistors DMTo1 and DMTe1 are set to the "D" level. As shown in FIG. 17, in the type-B, the memory cell transistors DMTo0 and DMTe0 are set to the "D" level, and the memory cell transistors DMTo1 and DMTe1 are set to the "Er" level. As shown in FIG. 18, in the type-C, the memory cell transistors DMTo0, DMTe0, DMTo1, and DMTe1 are set to the "Er" level. As shown in FIG. 19, in the type-D, the memory cell transistors DMTo0, DMTe0, DMTo1, and DMTe1 are set to the "Er" level.

In the case where the string select line STR_SEL is three or more layers (in the case where the j is three or more), one of the j memory cell transistors DMTo (the second memory cell) is in the "Er" level (erase state) and the other second memory cells are in the "D" level (write state).

In the case of the type-A memory pillar MP shown in FIG. 16, if VSEL is applied as the select voltage to the string select lines STR_SELo0 and STR_SELe0, and the read voltage VREAD is applied to the string select lines STR_SELo1 and STR_SELe1 (conditional (1)), the memory cell transistors DMTo0, DMTe0, DMTo1, and DMTe1 are all in the on-state. This state is referred to as a state in which the NAND strings 50o and 50e are in conductive state. On the other hand, unlike FIG. 16, if the read voltage VREAD is applied to the string select lines STR_SELo0 and STR_SELe0, and the select voltage VSEL is applied to the string select lines STR_SELo1 and STR_SELe1 (conditional (2)), the memory cell transistors DMTo1 and DMTe1 are in the off-state. This state is referred to as a state in which the NAND strings 50o and 50e are in non-conductive state. In this condition, if the voltage of the word lines WLo0 to WLo7 or the word lines WLe0 to WLe7 are increased, voltages of sources and drains of the memory cell transistors MTe and MTo are increased by capacitive coupling with WL. This phenomenon is said that the entire NAND strings 50o and 50e are boosted.

In the memory pillar MP of the type-B shown in FIG. 17, since the memory cell transistors DMTo1 and DMTe1 are in the off-state under the above condition (1), the NAND strings 50o and 50e are in the non-conductive state. On the other hand, since all the memory cell transistors DMTo0, DMTe0, DMTo1, and DMTe1 are in the on-state in the condition (2) described above, the NAND strings 50o and 50e are in the conductive state.

For the type-C and type-D memory pillars MP shown in FIG. 18 and FIG. 19, all the memory cell transistors DMTo0, DMTe0, DMTo1, and DMTe1 are in the on-state under any of the conditions (1) and (2), and thus the NAND strings 50o and 50e are in the conductive state.

The select gate line SGD0 may be referred to as a "first select gate line." The select gate line SGD1 may be referred to as a "second select gate line." The select gate line SGD2 may be referred to as a "third select gate line." The select gate line SGD3 may be referred to as a "fourth select gate line." As shown in FIG. 14, the select gate line SGD0 (first select gate line) faces the select gate line SGD1 (second select gate line) at a plurality of positions in the Y direction. The select gate line SGD2 (third select gate line) faces the select gate line SGD3 (fourth select gate line) at a plurality of positions in the Y direction. On the other hand, the select gate line SGD0 (first select gate line) faces the select gate line SGD3 (fourth select gate line) at single position in the Y direction. Similarly, the select gate line SGD1 (second select gate line) faces the select gate line SGD2 (third select gate line) at single position in the Y direction.

For example, in the case where the memory cell transistor MT belonging to the memory pillar MP0 is a read target, the type-A memory pillars MP0, MP4, MP5, MP8, MP12, and MP13 may be referred to as "first memory pillars." The type-B memory pillars MP2, MP6, MP7, MP10, MP14, and MP15 may be referred to as "second memory pillars." The type-C memory pillars MP1 and MP9 may be referred to as "third memory pillars." The type-D memory pillars MP3 and MP11 may be referred to as "fourth memory pillars."

In the case of expressing as described above, as shown in FIG. 14, the type-A memory pillar MP (first memory pillar) is sandwiched between the select gate line SGD0 (first select gate line) and the select gate line SGD1 (second select gate line). The type-B memory pillar MP (second memory pillar) is sandwiched between the select gate line SGD2 (third select gate line) and the select gate line SGD3 (fourth select gate line). The type-C memory pillar MP (third memory pillar) is sandwiched between the select gate line SGD1 (second select gate line) and the select gate line SGD2 (third select gate line). The type-D memory pillar MP (fourth memory pillar) is sandwiched between the select gate line SGD0 (first select gate line) and the select gate line SGD3 (fourth select gate line).

In other words, the type-B memory pillar MP (second memory pillar) is not adjacent to either the select gate line SGD0 (first select gate line) or the select gate line SGD1 (second select gate line). The type-C memory pillar MP (third memory pillar) is not adjacent to the select gate line SGD0 (first select gate line) but is adjacent to the select gate line SGD1 (second select gate line). The type-D memory pillar MP (fourth memory pillar) is not adjacent to the select gate line SGD1 (second select gate line) but is adjacent to the select gate line SGD0 (first select gate line).

In the case of expressing as described above, all of the j memory cell transistors DMTo0 and DMTo1 (second memory cells) and the j memory cell transistors DMTe0 and DMTe1 (fourth memory cells) respectively included in the type-A memory pillar MP (first memory pillar), the type-C memory pillar MP (third memory pillar), and the type-D memory pillar MP (fourth memory pillar) are controlled to be in the on-state when the read operation described above is executed. On the other hand, at least one of the j memory cell transistors DMTo0 and DMTo1 (second memory cells) and at least one of the j memory cell transistors DMTe0 and DMTe1 (fourth memory cells) included in the type-B memory pillar MP (second memory pillar) are controlled to be in the off-state when the read operation described above is executed.

Figure 20:
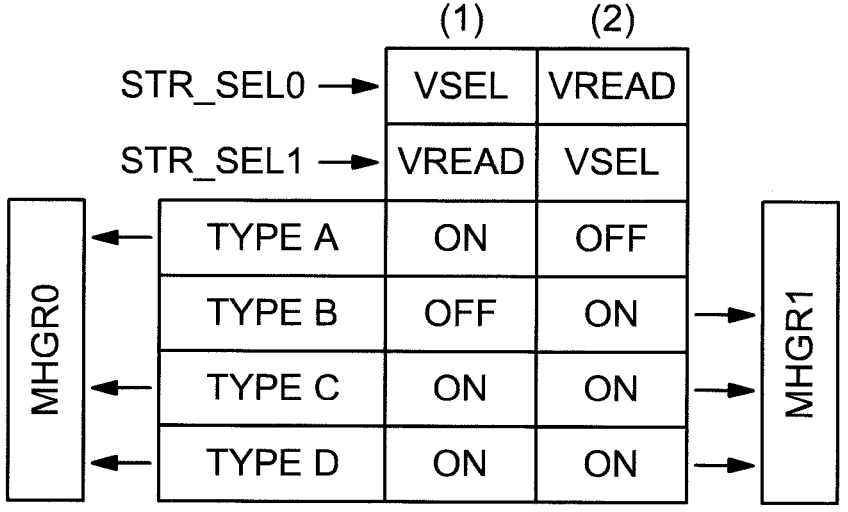
FIG. 20 is a diagram showing a relationship between a type of a memory pillar and a memory pillar group in a semiconductor memory device according to an embodiment.

As shown in FIG. 20, the types-A, C, and D memory pillars MP (the first memory pillar, the third memory pillar, and the fourth memory pillar) that are in the on-state (ON) according to the condition (1) are allocated to the memory pillar group MPGR0. The types-B, C, and D memory pillars MP (second memory pillar, third memory pillar, and fourth memory pillar) that are in the on-state (ON) according to the condition (2) are allocated to the memory pillar group MPGR1. Since the memory pillar group MPGR0 or the memory pillar group MPGR1 is selected, the memory cell transistors DMT (second memory cell and fourth memory cell) belonging to these memory pillar groups are commonly controlled.

FIG. 21 is a simplified table of FIG. 20. In FIG. 21, "○" is displayed in the memory pillar groups MPGR that are in the on-state in the case where the select voltage VSEL (for example, 2 V) is applied to the string select line STR_SEL. As shown in FIG. 21, the NAND strings 50 included in the memory pillar group MPGR0 become conductive state, and the "other" NAND strings 50o and 50e become non-conductive state in the case where the select voltage VSEL is applied to the string select line STR_SEL0. On the other hand, when the select voltage VSEL is applied to the string select line STR_SEL1, the NAND strings 50 included in the memory pillar group MPGR1 become conductive state, and the "other" NAND strings 50o and 50e become non-conductive state.

Figure 22:
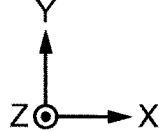
FIG. 22 is a layout diagram showing a relationship between a type of a memory pillar and a memory pillar group in a semiconductor memory device according to an embodiment.

FIG. 22 shows a state in which the select voltage VSEL is applied to the string select line STR_SEL0, and the NAND strings 50 included in the memory pillar group MPGR0 become conductive state, as shown in FIG. 21. As shown in FIG. 22, in addition to the NAND strings 50 included in the memory pillars MP0, MP4, MP5, MP8, MP12, and MP13 sandwiched between the select gate lines SGD0 and SGD1, the NAND strings 50 included in the memory pillars MP1, MP3, MP9, and MP11 adjacent to one of the select gate lines SGD0 and SGD1 become conductive state. In this case, the NAND strings 50 adjacent to the unselected select gate lines SGD2 and SGD3 among the NAND strings 50 provided in the memory pillars MP1, MP3, MP9, and MP11 also become conductive state.

In the above cases, the NAND strings 50 provided in each of the memory pillars MP2, MP6, MP7, MP10, MP14, and MP15 become non-conductive state. Therefore, if a high voltage is applied to the word line WL during the read operation, potential of the channels of the memory cell transistor MT is boosted, however, generation of read disturbance in these memory pillars MP can be suppressed.

On the other hand, since the NAND strings 50 provided in the memory pillars MP1, MP3, MP9, and MP11 become conductive state, generation of the read disturb in the NAND strings 50 can be suppressed.

Figure 23:
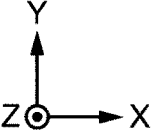
FIG. 23 is a layout diagram showing a relationship between a type of a memory pillar and a memory pillar group in a semiconductor memory device according to an embodiment.

FIG. 23 shows a state in which the select voltage VSEL is applied to the string select line STR_SEL1, and the NAND strings 50 included in the memory pillar group MPGR1 becomes conductive state, as shown in FIG. 21. As shown in FIG. 23, in addition to the NAND strings 50 included in the memory pillars MP2, MP6, MP7, MP10, MP14, and MP15 sandwiched between the select gate lines SGD2 and SGD3, the NAND strings 50 included in the memory pillars MP1, MP3, MP9, and MP11 adjacent to one of the select gate lines SGD2 and SGD3 become conductive state. In this case, the NAND strings 50 adjacent to the unselected select gate lines SGD0 and SGD1 among the NAND strings 50 provided in the memory pillars MP1, MP3, MP9, and MP11 also become conductive state.

In the case described above, the NAND strings 50 provided in each of the memory pillars MP0, MP4, MP5, MP8, MP12, and MP13 become non-conductive state. Therefore, if a high voltage is applied to the word line WL during the read operation, the potential of the channels of the memory cell transistor MT is boosted, however, generation of read disturbance in these memory pillar MP can be suppressed.

As described above, since the memory pillars MP adjacent to both of the select gate lines SGD0 and SGD1 can be collectively selected, the number of the string select lines STR_SEL and the memory cell transistors DMT can be made smaller than the number of the select gate lines SGD. In the present embodiment, since two select gate lines SGD can be selected by one string select line STR_SEL and one memory cell transistor DMT, the number of the string select lines STR_SEL and the memory cell transistors DMT can be set to ½ of the number of the select gate lines SGD.

1-9. Timing Chart in Read Operation

Figure 24:
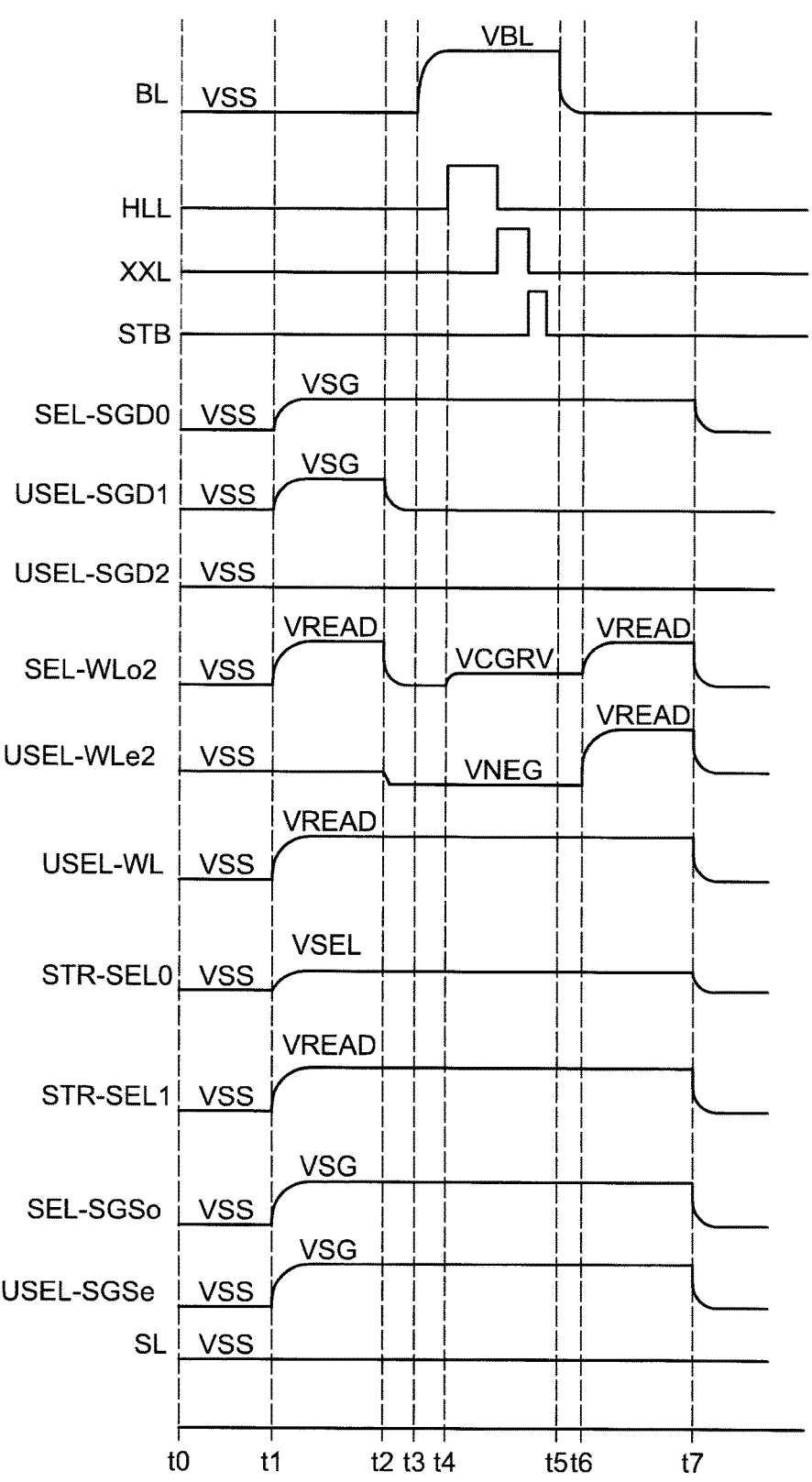
FIG. 24 is a timing chart showing a read operation in a semiconductor memory device according to an embodiment.

A data read operation in a NAND flash memory having the above configuration will be described with reference to FIG. 24. FIG. 24 is a timing chart showing a read operation in a semiconductor memory device according to an embodiment. FIG. 24 shows a read operation for the memory cell transistor MTo2 included in the NAND string 50o belonging to the type-A memory pillar MP adjacent to the select gate line SGD0.

In FIG. 24, the "SEL-BL" is a bit line selected in the read operation. In other words, "SEL-BL" is a bit line connected to the memory cell transistor MT which is a target of the read operation. the "USEL-BL" is an unselected bit line. the "HLL," "XLL," and "STB" are control signals for controlling the sense amplifier 31.

The "SEL-" refers to a control signal line connected to the selected select transistor and the memory cell transistor in the read operation. The "USEL-" refers to a control signal line connected to the unselected select transistor and the memory cell transistor.

As shown in FIG. 24, at a time t1, the voltage VSG is applied to the selected select gate line SGD0 (SEL-SGD0) and the unselected select gate line SGD1 (USEL-SGD1), and the select transistor ST1 is in the on-state. Similarly, at the time t1, the voltage VSG is applied to the all select gate lines SGS (SEL-SGSo and USEL-SGSe) in the select block BLK, and the select transistor ST2 is in the on-state. On the other hand, the voltage VSS is applied to the select gate lines SGD2 and SGD3 (USEL-SGD2) and the select transistor ST1 is in the off-state.

As shown in FIG. 24, at the time t1, the voltage VREAD is applied to the word lines SEL-WLo2 and USEL-WL, and the memory cell transistors MTo0 to MTo7, MTe0 to MTe1, and MTe3 to MTe7 connected to these word lines are in the on-state regardless of hold data. At the time t1, the voltage VSS is continuously applied to the word line USEL-WLe2 connected to a memory cell transistor MTe2. At the time t1, the select voltage VSEL is applied to the string select line STR_SEL0, and the read voltage VREAD is applied to the string select line STR_SEL1. That is, as shown in FIG. 21, the memory pillar group MPGR0 is selected. The operation described above is an initial operation in the read operation.

Referring to FIG. 13, the memory cell transistor MTo2 connected to the word line SEL-WLo2 and the memory cell transistor MTe2 connected to the word line USEL-WLe2 share channels with each other.

As described above, since the voltage VSG is applied to the select gate lines SEL-SGD0 and USEL-SGD1 and the select gate lines SEL-SGSo and USEL-SGSe, the select transistors ST1 and ST2 are in the on-state. Since the voltage VREAD is applied to the word lines SEL-WLo2 and USEL-WL and the voltage VSS is applied to the word line USEL-WLe2, the memory cell transistors MT other than the memory cell transistors MTe2 are in the on-state regardless of the hold data. As a result, VSS (for example, 0 V) is applied to all the channels of the memory cell transistors MT other than the memory cell transistor MTe2. That is, the channel clean operation is performed on the memory cell transistors MT belonging to the memory pillars MP4, MP12, MP0, MP8, MP5, MP13, MP1, MP9, MP3, and MP11 by the operation described above. On the other hand, since the select transistor is in the off-state, the channels of the memory cell transistors MT belonging to MP6, MP14, MP2, MP10, MP7, and MP15 are boosted by the capacitive coupling with WL.

That is, when executing or prior to executing a read operation for the memory cell transistor MT belonging to the type-A memory pillar MP (first memory pillar) and the type-D memory pillar MP (fourth memory pillar) adjacent to the select gate line SGD0 (first select gate line), the select transistor STo1 (first transistor), the i memory cell transistors MTo0 to MTo7 (first memory cells), the j memory cell transistors DMTo0 and DMTo1 (second memory cells), the select transistor STe1 (second transistor), the i memory cell transistors MTe0 to MTe7 (third memory cells), and the j memory cell transistors DMTe0 and DMTe1 (fourth memory cells) included in the type-A memory pillar MP, the type-C memory pillar MP (third memory pillar), and the type-D memory pillar MP are controlled to be in the on-state.

Next, at a time t2, the voltage VSS is applied to the select gate line USEL-SGD1. The select transistor ST1 of the unselected NAND string 50 is in the off-state by this operation. Similarly, at the time t2, the voltage VSS is applied to the word line SEL-WLo2. Similarly, at the time t2, a voltage VNEG is applied to the word line USEL-WLe2. In other words, the voltage applied to the word line SEL-WLo2 drops from the voltage VREAD to the voltage VSS, and the voltage applied to the word line USEL-WLe2 drops. The voltage VNEG is a voltage for forcibly turning the memory cell transistor MT to the off-state regardless of charges accumulated in the memory cell transistor MT. That is, the voltage VNEG is a voltage that is sufficiently lower than the threshold voltage of the memory cell transistor MT in the erased state. Even after the time t2 has elapsed, the voltage VSG is continuously applied to the select gate line SEL-SGD0, the select gate lines SEL-SGSo and USEL- SGSe. Similarly, even after the time t2 has elapsed, the voltage VREAD is continuously applied to the USEL-WL. The entire unselected NAND strings 50 are boosted by the operation described above.

Next, at a time t3, the bit line SEL-BL selected in the read operation is precharged. A voltage VBL is applied to the selected bit line SEL-BL by this operation.

Next, at a time t4, in a state where the voltage VSG is applied to the select gate line SEL-SGD0, the select gate lines SEL-SGSo and USEL-SGSe, the read voltage VCGRV is applied to the selected word line SEL-WLo2. At the time t4, the voltage VNEG is applied to the unselected word line USEL-WLe2, and the voltage VREAD is applied to the unselected word line USEL-WL. The read voltage VCGRV is a voltage corresponding to a read level, and is a voltage for determining held data of the selected memory cell transistor MT. As shown in FIG. 24, at the time t4, the control signal HLL, the control signal XXL, and the control signal STB for controlling the sense amplifier 31 are applied.

Next, after the read operation is finished, the voltage applied to the selected bit line SEL-BL changes from the voltage VBL to the voltage VSS at a time t5. Next, at a time t6, the voltage VREAD is applied to the selected word line SEL-WLo2 and the unselected word line USEL-WLe2.

As described above, according to the memory system of the present embodiment, the number of the string select lines STR_SEL and the memory cell transistors DMT can be made smaller than the number of the select gate lines SGD. In the present embodiment, the number of the string select lines STR_SEL and the memory cell transistors DMT can be set to ½ or less of the number of the select gate lines SGD. Further, as described above, the channel clean operation is performed in the initial operation of the read operation for the NAND strings 50 belonging to the memory pillars MP included in the memory pillar groups MPGR, and the channels of the memory cell transistors MT are boosted for the NAND strings 50 belonging to the memory pillars MP not included in MPGR, so that it is possible to suppress the generation of read disturbance and reduce the power consumption.

1-10. Modification

In the embodiment described above, a configuration in which the select gate lines SGD0 to SGD3 are separated into four (a configuration in which the n is 2) is exemplified. However, the numbers of the select gate lines SGD are not limited to the embodiments described above. For example, a configuration in which the select gate lines are separated into sixteen (SGD0 to SGD15) (a configuration in which the n is 8) may be used. In this case, as shown in FIG. 25, the memory pillars MP adjacent to the select gate lines SGD0 to SGD15 are allocated to 8 memory pillar groups MPGR0 to MPGR7.

Specifically, the memory pillars MP adjacent to the select gate lines SGD0 and SGD8 are allocated to the memory pillar group MPGR0. The memory pillars MP adjacent to the select gate lines SGD1 and SGD9 are allocated to the memory pillar group MPGR1. The memory pillars MP adjacent to the select gate lines SGD2 and SGD10 are allocated to the memory pillar group MPGR2. The memory pillars MP adjacent to the select gate lines SGD3 and SGD11 are allocated to the memory pillar group MPGR3. The memory pillars MP adjacent to the select gate lines SGD4 and SGD12 are allocated to the memory pillar group MPGR4. The memory pillars MP adjacent to the select gate lines SGD5 and SGD13 are allocated to the memory pillar group MPGR5. The memory pillars MP adjacent to the select gate lines SGD6 and SGD14 are allocated to the memory pillar group MPGR6. The memory pillars MP adjacent to the select gate lines SGD7 and SGD15 are allocated to the memory pillar group MPGR7.

As shown in FIG. 25, for example, in the case where the select voltage VSEL is applied to the string select line STR_SEL0, the NAND string 50 belonging to the memory pillar group MPGR0 becomes conductive state, and the remaining NAND strings 50 become non-conductive state.

2. Second Embodiment

A memory system according to a second embodiment will be described with reference to FIG. 26. FIG. 26 is similar to FIG. 25. In FIG. 25, the string select lines STR_SEL and the memory pillar groups MPGR correspond to each other in a one-to-one manner, whereas in FIG. 26, the memory pillar groups MPGR are identified by combining a plurality of string select lines STR_SEL.

As shown in FIG. 26, when the select voltage VSEL is applied to the string select lines STR_SEL0 and STR_SEL1, the memory pillar group MPGR0 is selected. When the select voltage VSEL is applied to the string select lines STR_SEL0 and STR_SEL2, the memory pillar group MPGR1 is selected. When the select voltage VSEL is applied to the string select lines STR_SEL0 and STR_SEL3, the memory pillar group MPGR2 is selected. When the select voltage VSEL is applied to the string select lines STR_SEL0 and STR_SEL4, the memory pillar group MPGR3 is selected. The remaining memory pillar groups MPGR4 to MPGR7 are also selected according to the two string select lines STR_SEL as shown in FIG. 26.

That is, in the case of the present embodiment, a plurality (two in the case of the present embodiment) of the second memory cells among the j memory cell transistors DMTo (second memory cells) are in the "Er" level (erased state) and the other second memory cells are in the "D" level (written state).

As described above, in the present embodiment, the memory pillar groups MPGR are selected by selecting two from the five string select lines STR_SEL. Therefore, in order to select two from the five string select lines STR_SEL, it is possible to select up to $_5C_2=10$ memory pillar groups MPGR.

As described above, according to the memory system of the present embodiment, the number of the string select lines STR_SEL and the number of the memory cell transistors DMT can be further reduced than the number of the select gate lines SGD as compared with the first embodiment.

3. Third Embodiment

A memory system according to a third embodiment will be described with reference to FIG. 27 to FIG. 30. FIG. 27 to FIG. 30 are similar to FIG. 16 to FIG. 19. FIG. 27 to FIG. 30 are different from the configurations shown in FIG. 16 to FIG. 19 in that different control voltages are applied to the string select lines STR_SELo and STR_SELe.

Figure 27:
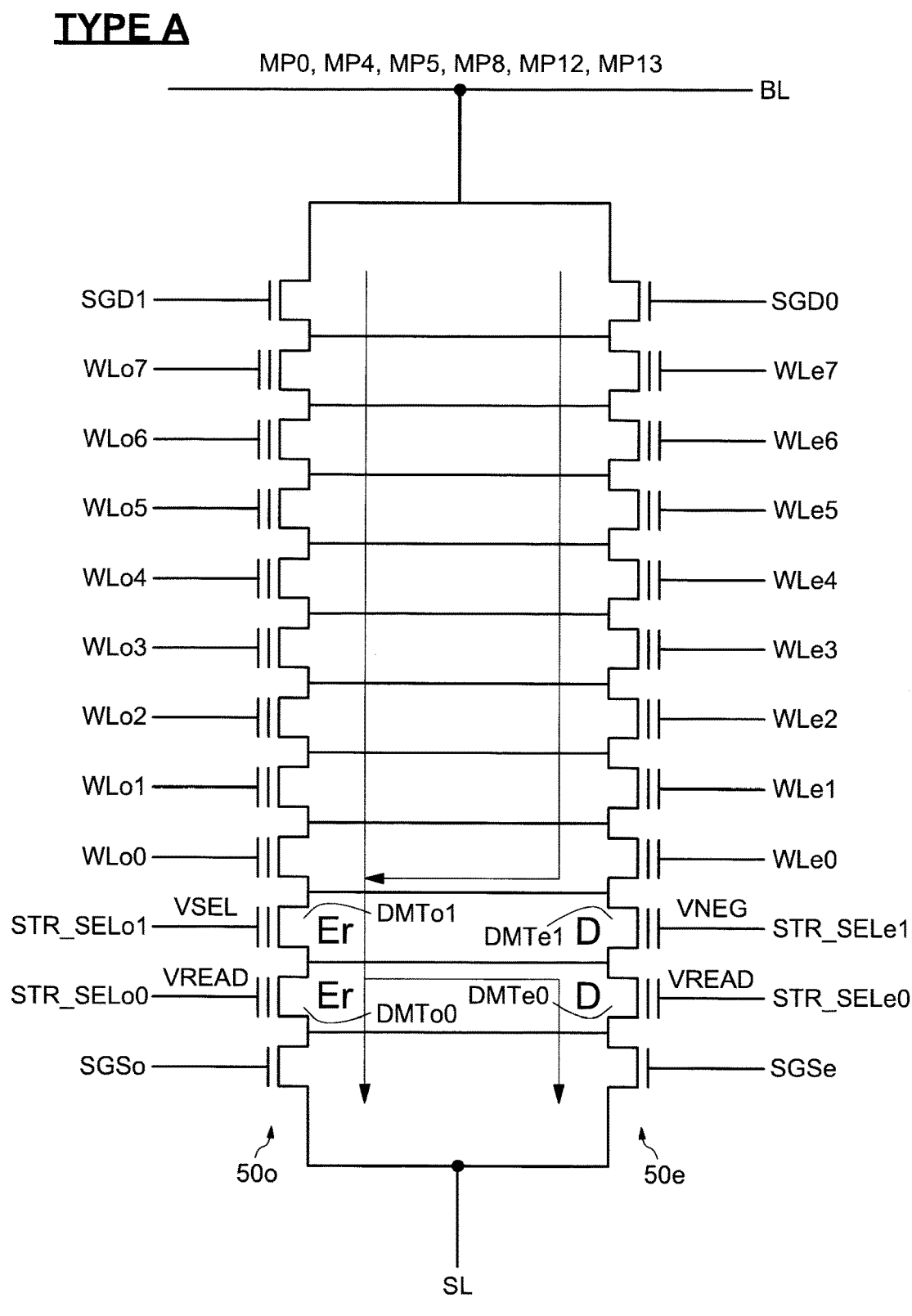
FIG. 27 is an equivalent circuit diagram showing a read operation of a semiconductor memory device according to an embodiment.

As shown in FIG. 27, in the case of the type-A memory pillar MP, the memory cell transistor DMTo0 is set to the "Er" level, the memory cell transistor DMTe0 is set to the "D" level, the memory cell transistor DMTo1 is set to the "Er" level, and the memory cell transistor DMTe1 is set to the "D" level.

Figure 28:
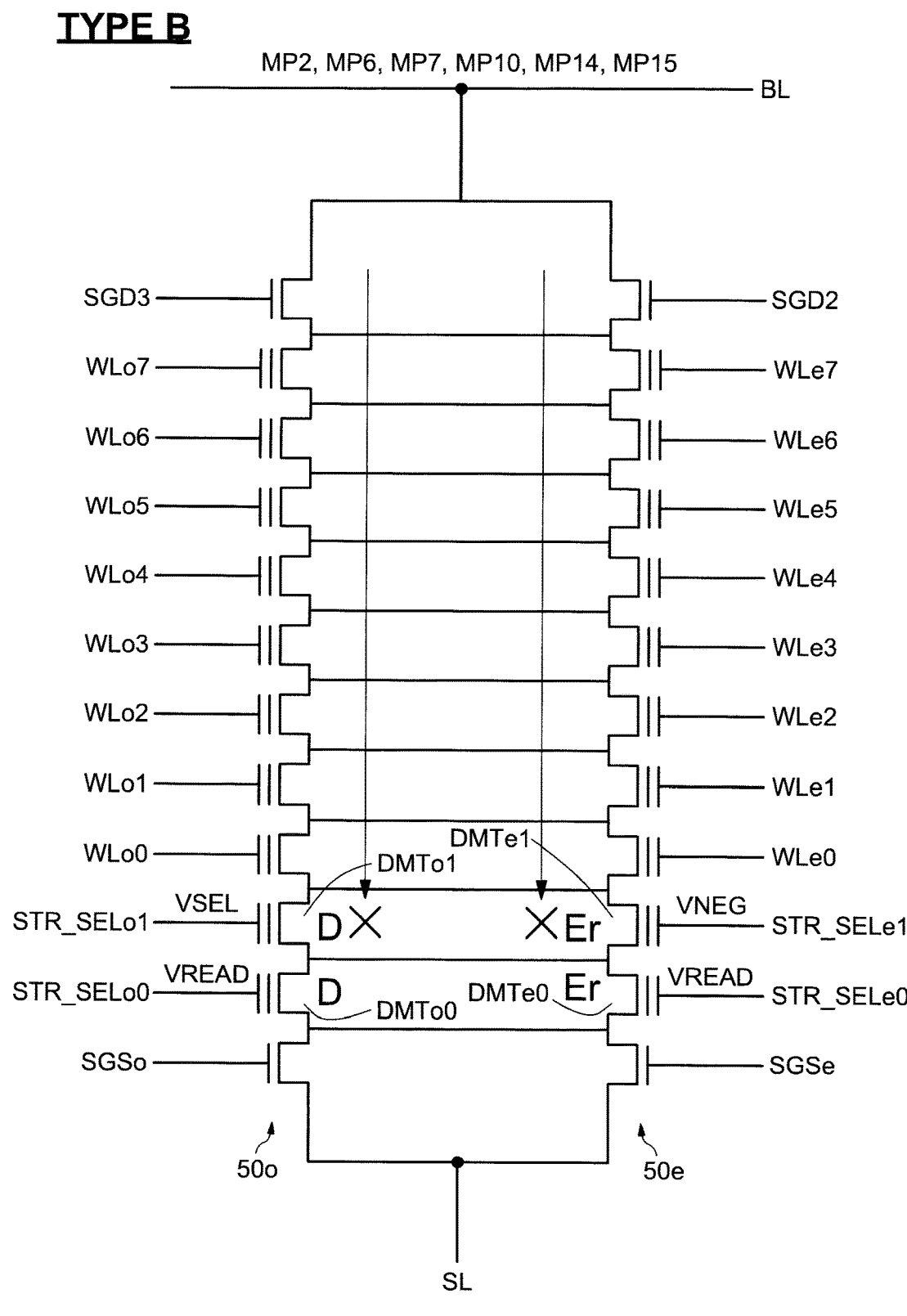
FIG. 28 is an equivalent circuit diagram showing a read operation of a semiconductor memory device according to an embodiment.

As shown in FIG. 28, in the case of the type-B memory pillar MP, the memory cell transistor DMTo0 is set to the "D" level, the memory cell transistor DMTe0 is set to the "Er" level, the memory cell transistor DMTo1 is set to the "D" level, and the memory cell transistor DMTe1 is set to the "Er" level.

Figure 29:
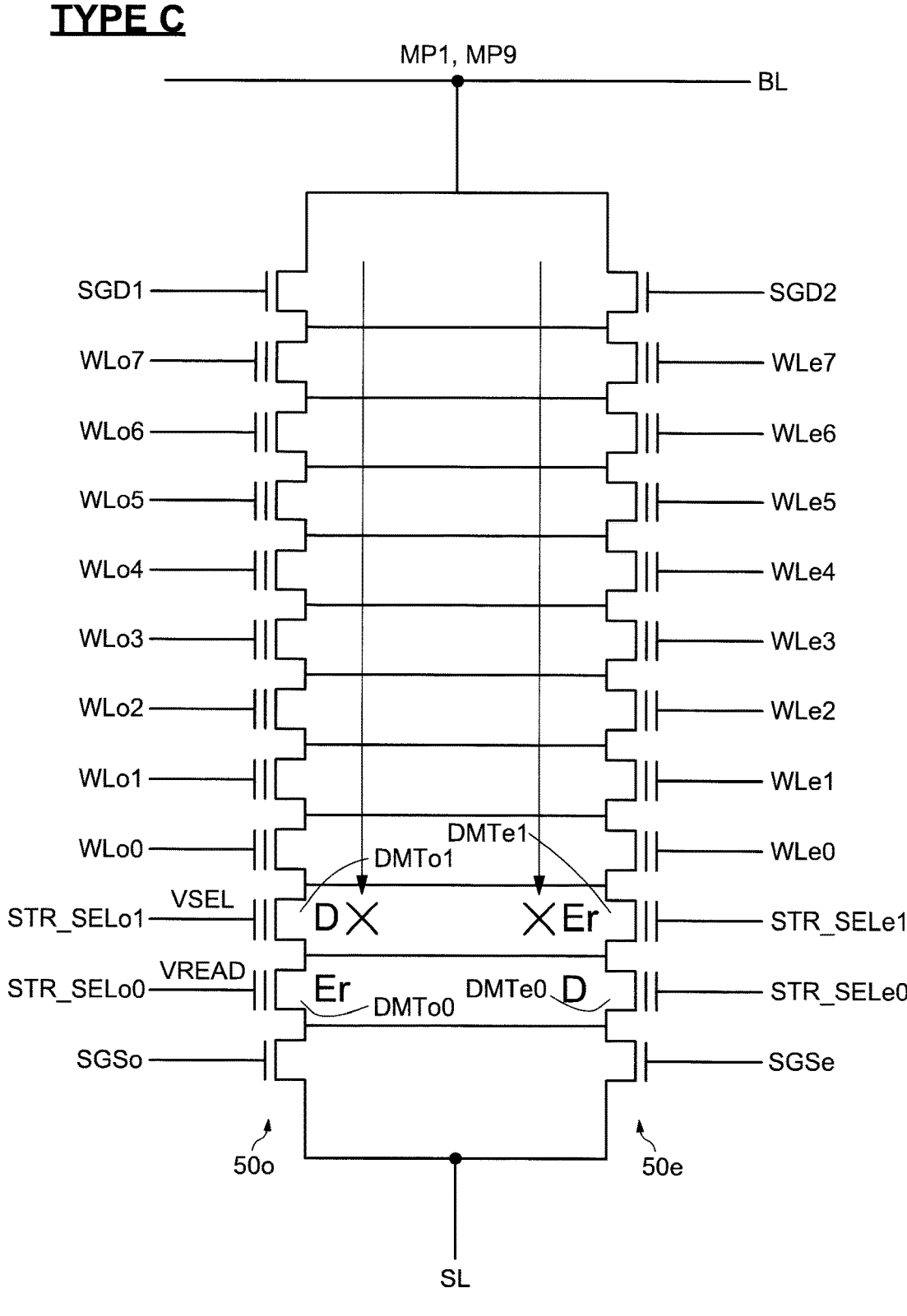
FIG. 29 is an equivalent circuit diagram showing a read operation of a semiconductor memory device according to an embodiment.

As shown in FIG. 29, in the case of the type-C memory pillar MP, the memory cell transistor DMTo0 is set to the "Er" level, the memory cell transistor DMTe0 is set to the "D" level, the memory cell transistor DMTo1 is set to the "D" level, and the memory cell transistor DMTe1 is set to the "Er" level.

Figure 30:
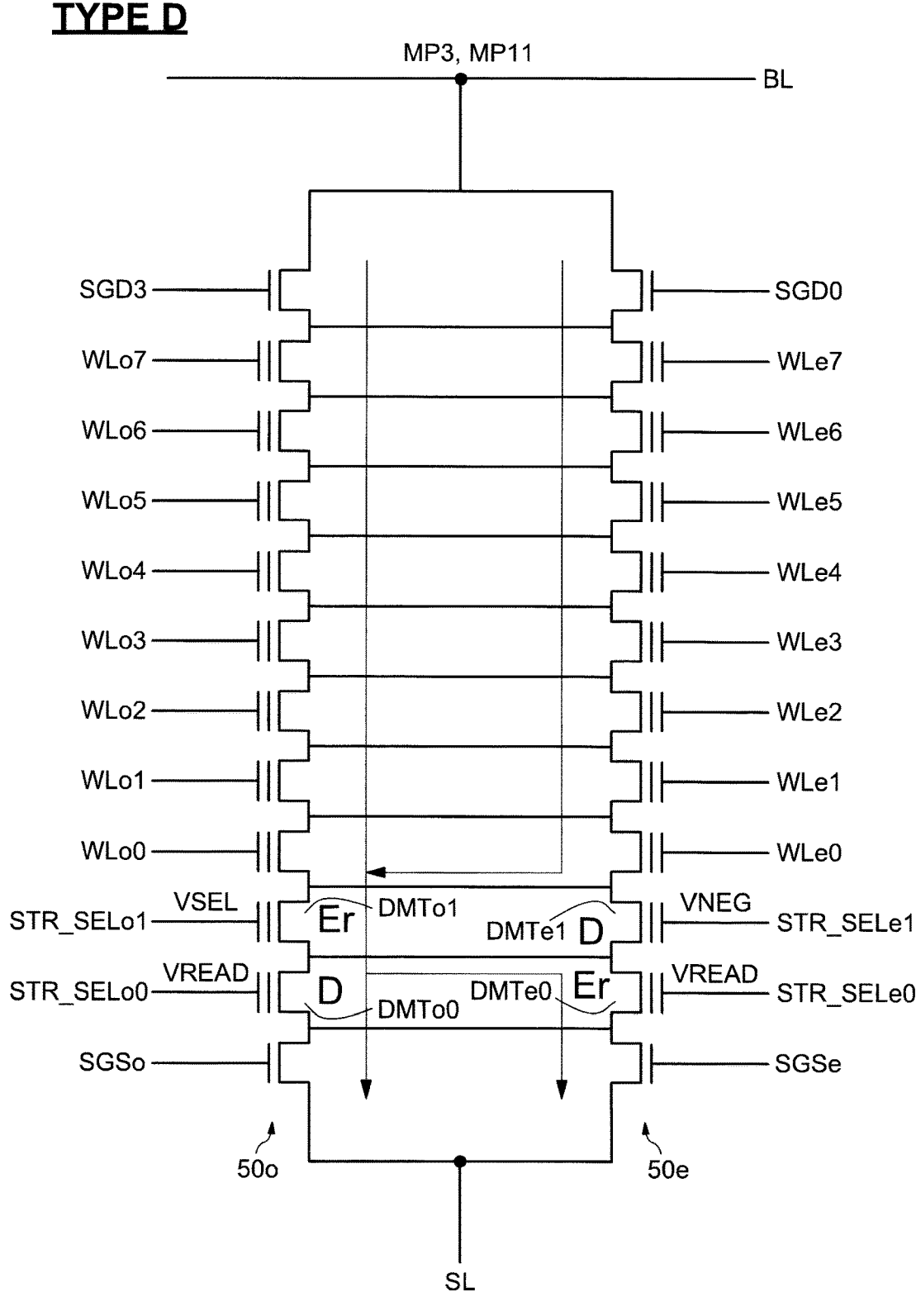
FIG. 30 is an equivalent circuit diagram showing a read operation of a semiconductor memory device according to an embodiment.

As shown in FIG. 30, in the case of the type-D memory pillar MP, the memory cell transistor DMTo0 is set to the "D" level, the memory cell transistor DMTe0 is set to the "Er" level, the memory cell transistor DMTo1 is set to the "Er" level, and the memory cell transistor DMTe1 is set to the "D" level.

In the case of present embodiment, selection of the memory pillar groups MPGR is controlled by the voltage applied to the string select line STR_SEL. The configurations shown in FIG. 27 to FIG. 30 are configurations in which the memory pillars MP of type-A and type-D are selected.

As shown in FIG. 27, in the type-A memory pillar MP, when the read voltage VREAD is applied to the string select lines STR_SELo0 and STR_SELe0, the memory cell transistors DMTo0 and DMTe0 are in the on-state. When the select voltage VSEL is applied to the string select line STR_SELo1, the memory cell transistor DMTo1 is in the on-state. When the voltage VNEG is applied to the string select line STR_SELe1, the memory cell transistor DMTe1 is in the off-state. Sources and drains of the memory cell transistors DMTe1 and DMTo1 are electrically connected to each other. Therefore, even if the memory cell transistor DMTe1 is in the off-state, a current flowing through the NAND string 50e reaches the source line SL via the memory cell transistor DMTo1. As described above, if the string select line STR_SEL is controlled as shown in FIG. 27, the NAND strings 50 belonging to the type-A memory pillar MP become conductive state.

As shown in FIG. 28, if the select voltage VSEL is applied to the string select line STR_SELo1 with respect to the type-B memory pillar MP, the memory cell transistor DMTo1 is in the off-state. If the voltage VNEG is applied to the string select line STR_SELe1, the memory cell transistor DMTe1 is in the off-state. Therefore, if the string select line STR_SEL is controlled as described above, the NAND strings 50 belonging to the type-B memory pillar MP become non-conductive state.

As shown in FIG. 29, if the select voltage VSEL is applied to the string select line STR_SELo1 with respect to the type-C memory pillar MP, the memory cell transistor DMTo1 is in the off-state. If the voltage VNEG is applied to the string select line STR_SELe1, the memory cell transistor DMTe1 is in the off-state. Therefore, if the string select line STR_SEL is controlled as described above, the NAND strings 50 belonging to the type-C memory pillar MP become non-conductive state.

As shown in FIG. 30, if the read voltage VREAD is applied to the string select lines STR_SELo0 and STR_SELe0 with respect to the type-D memory pillar MP, the memory cell transistors DMTo0 and DMTe0 are in the on-state. If the select voltage VSEL is applied to the string select line STR_SELo1, the memory cell transistor DMTo1 is in the on-state. If the voltage VNEG is applied to the string select line STR_SELe1, the memory cell transistor DMTe1 is in the off-state. Even if the memory cell transistor DMTe1 is in the off-state, the current flowing through the NAND string 50*e* reaches the source line SL via the memory cell transistor DMTo1, as in the explanation of FIG. 27. As described above, if the string select line STR_SEL is controlled as shown in FIG. 30, the NAND strings 50 belonging to the type-D memory pillar MP become conductive state.

As shown in FIG. 27 to FIG. 30, since the following voltages are applied to the string select line STR_SEL, the NAND strings 50 belonging to the type-A and type-D memory pillars MP become conductive state, and the NAND strings 50 belonging to the type-B and type-C memory pillars MP become non-conductive state.

STR_SELo0=VREAD
    STR_SELe0=VREAD
    STR_SELo1=VSEL
    STR_SELe1=VNEG

As described above, since the following voltages are applied to the string select line STR_SEL, the NAND strings 50 belonging to the type-A and the type-C memory pillars MP become conductive state, and the NAND strings 50 belonging to the type-B and type-D memory pillars MP become non-conductive state.

STR_SELo0=VSEL
    STR_SELe0=VNEG
    STR_SELo1=VREAD
    STR_SELe1=VREAD

As described above, since the following voltages are applied to the string select line STR_SEL, the NAND strings 50 belonging to the type-B and the type-C memory pillars MP become conductive state, and the NAND strings 50 belonging to the type-A and type-D memory pillars MP become non-conductive state.

STR_SELo0=VREAD
    STR_SELe0=VREAD
    STR_SELo1=VNEG
    STR_SELe1=VSEL

As described above, since the following voltages are applied to the string select line STR_SEL, the NAND strings 50 belonging to the type-B and the type-D memory pillars MP become conductive state, and the NAND strings 50 belonging to the type-A and type-C memory pillars MP become non-conductive state.

STR_SELo0=VNEG
    STR_SELe0=VSEL
    STR_SELo1=VREAD
    STR_SELe1=VREAD

As described above, the conduction state or the non-conduction state of the NAND strings 50 can be controlled by controlling the voltages applied to four memory cell transistors DMT and four string select lines STR_SEL. Specifically, since different voltages are applied to the memory cell transistors DMT facing each other and sharing the semiconductor layers, the memory pillar MP to be read can be selected from the type-A to type-D memory pillars MP.

Although the present disclosure has been described with reference to the drawings, the present disclosure is not limited to the embodiments described above, and can be appropriately modified without departing from the spirit of the present disclosure. For example, the addition, deletion, or design change of the constituent elements as appropriate by those skilled in the art based on the memory system of the present embodiments are also included in the scope of the present disclosure as long as they are provided with the gist of the present disclosure. Furthermore, the embodiments described above can be appropriately combined as long as there are no mutual contradictions, and technical matters common to the embodiments are included in the embodiments without explicit description.

It is to be understood that the present disclosure provides other operational effects that are different from the operational effects provided by the aspects of the embodiments described above, and those that are obvious from the description of the present specification or those that can be easily predicted by a person skilled in the art.

What is claimed is:

1. A memory system comprising:
a source line expanding to a first direction and a second direction intersecting with the first direction;
a string select line provided in j layers ("j" is one or more integer number) and provided in a third direction intersecting the first direction and the second direction with respect to the source line;
a first word line provided in i layers ("i" is two or more integer number) stacked in the third direction and provided in the third direction with respect to the string select line;
a second word line provided in i layers, provided in the third direction with respect to the string select line and stacked in the third direction, a position of the second word line provided in i layers in the third direction being the same as the first word line provided in i layers;
a select gate line provided in 1 layer provided in the third direction with respect to the first word line and the second word line, and divided into 2n ("n" is one or more integer number) in a plane expanding to the first direction and the second direction;
a plurality of memory pillars having semiconductor layers, provided between the first word line and the second word line, provided between the select gate lines facing each other among the 2n select gate lines, and extended in the third direction; and
a control circuit,
wherein
the plurality of memory pillars is electrically connected to the source line,
each of the plurality of memory pillars has a first string provided in a first side of the memory pillar and a second string provided in a second side of the memory pillar,
the first string has a first transistor, i first memory cells and j second memory cells,
the i first memory cells are provided between the first transistor and the second memory cell closest to the first transistor among the j second memory cells,
the first transistor, the i memory cells, and the j second memory cells are electrically connected in series,
the first transistor is connected to one of the select gate line among the 2n select gate lines,
the i first memory cells are electrically connected in series, provided along the third direction, and respectively connected to the first word line provided in i layers,
the second string has a second transistor, i third memory cells, and j fourth memory cells,
the i third memory cells are provided between the second transistor and the fourth memory cell closest to the second transistor among the j fourth memory cells,
the second transistor, the i third memory cells and the j fourth memory cells are electrically connected in series, the second transistor is connected to one of the select gate line among the 2n select gate lines, the i third memory cells are electrically connected in series, provided along the third direction, and respectively connected to the second word line provided in i layers, a position of the #1 first word line among the first word line provided in i layers is the closest to a position of the source line, and a position of the #i first word line is the farthest from the position of the source line, a position of the #1 second word line among the second word line provided in i layers is the closest to the position of the source line and a position of the #i second word line is the farthest from the position of the source line, the i first memory cells and the i third memory cells share the semiconductor layer, and j is no larger than n in the second memory cell and the fourth memory cell.

2. The memory system according to claim 1, wherein the select gate line includes a first select gate line, a second select gate line, a third select gate line and a fourth select gate line, the first select gate line faces the second select gate line, the third select gate line faces the fourth select gate line, the plurality of memory pillars includes a first memory pillar and a second memory pillar, the first memory pillar includes a target memory cell in a read operation and is sandwiched by the first select gate line and the second select gate line, the second memory pillar is sandwiched by the third select gate line and the fourth select gate line, and the control circuit is configured to control all of the j second memory cells and the j fourth memory cells included in the first memory pillar to an on-state, and control one of the j second memory cells included in the second memory pillar and one of the j fourth memory cells included in the second memory pillar to an off-state.

3. The memory system according to claim 1, wherein the select gate line includes a first select gate line, a second select gate line, a third select gate line, and a fourth select gate line, the first select gate line faces the second select gate line, the second select gate line faces the third select gate line, the third select gate line faces the fourth select gate line, the plurality of memory pillars includes a first memory pillar, a second memory pillar, and a third memory pillar, the first memory pillar includes a target memory cell in a read operation and is sandwiched by the first select gate line and the second select gate line, the third memory pillar is sandwiched by the second select gate line and the third select gate line, the second memory pillar is sandwiched by the third select gate line and the fourth select gate line, and the control circuit is configured to control all of the j second memory cells and the j fourth memory cells included in each of the first memory pillar and the third memory pillar to an on-state, and control one of the j second memory cells included in the second memory pillar and one of the j fourth memory cells included in the second memory pillar to an off-state.

4. The memory system according to claim 3, wherein the control circuit is configured to control the first transistor, the i first memory cells, the j second memory cells, the second transistor, the i third memory cells and the j fourth memory cells included in the third memory pillar to the on-state.

5. The memory system according to claim 1, wherein the select gate line includes a first select gate line and a second select gate line, the first select gate line faces the second select gate line, the plurality of memory pillars includes a first memory pillar, a second memory pillar, a third memory pillar, and a fourth memory pillar, the first memory pillar is sandwiched by the first select gate line and the second select gate line, the second memory pillar is not immediately adjacent to any one of the first select gate line and the second select gate line, the third memory pillar is not immediately adjacent to the first select gate line and is immediately adjacent to the second select gate line, the fourth memory pillar is not adjacent to the second select gate line and is adjacent to the first select gate line, and the control circuit is configured to control the second memory cell and the fourth memory cell belonging to a memory pillar group with the first memory pillar, the third memory pillar, and the fourth memory pillar as the memory pillar group.

6. The memory system according to claim 5 wherein one of the second memory cells among the j second memory cells is in an erased state and the other of the second memory cells are in a written state, and the control circuit is configured to commonly control all of the second memory cells belonging the memory pillar group.

7. The memory system according to claim 5, wherein a plurality of the second memory cells among the j second memory cells is an erased state and the other of the second memory cells are written state, and the control circuit is configured to commonly control all of the second memory cells belonging the memory pillar group.

8. The memory system according to claim 1, wherein the select gate line includes a first select gate line and a second select gate line, the first select gate line faces the second select gate line, the plurality of memory pillars includes a first memory pillar, a second memory pillar, a third memory pillar, and a fourth memory pillar, the first memory pillar is sandwiched by the first select gate line and the second select gate line, the second memory pillar is not immediately adjacent to any one of the first select gate line and the second select gate line, the third memory pillar is not immediately adjacent to the first select gate line and is immediately adjacent to the second select gate line, the fourth memory pillar is not immediately adjacent to the second select gate line and is immediately adjacent to the first select gate line, the j second memory cells and the j fourth memory cells share the semiconductor layer, and the control circuit is configured to select a target memory pillar for read operation from the first memory pillar, the second memory pillar, the third memory pillar, and the fourth memory pillar by supplying different voltage to the string select line connected to the memory cell and the string select line connected to the fourth memory cell.

* * * * *